(12) United States Patent
Ogawa et al.

(10) Patent No.: US 7,962,320 B2
(45) Date of Patent: Jun. 14, 2011

(54) METHOD, APPARATUS AND PROGRAM FOR CREATING A POWER PIN MODEL OF A SEMICONDUCTOR INTEGRATED CIRCUIT

(75) Inventors: Masashi Ogawa, Minato-ku (JP); Hiroshi Wabuka, Minato-ku (JP)

(73) Assignee: NEC Corporation, Tokyo (JP)

( * ) Notice: Subject to any disclaimer, the term of this patent is extended or adjusted under 35 U.S.C. 154(b) by 830 days.

(21) Appl. No.: 11/914,066

(22) PCT Filed: May 9, 2006

(86) PCT No.: PCT/JP2006/309319
§ 371 (c)(1),
(2), (4) Date: Nov. 9, 2007

(87) PCT Pub. No.: WO2006/121042
PCT Pub. Date: Nov. 16, 2006

(65) Prior Publication Data
US 2008/0215303 A1  Sep. 4, 2008

(30) Foreign Application Priority Data

May 12, 2005 (JP) ................................. 2005-139923

(51) Int. Cl.
*G06F 17/50* (2006.01)
(52) U.S. Cl. .......................................... 703/13
(58) Field of Classification Search ...................... 703/13
See application file for complete search history.

(56) References Cited

U.S. PATENT DOCUMENTS 6,577,994 B1 * 6/2003 Tsukuda ........................ 703/15
2002/0011885 A1 * 1/2002 Ogawa et al. ................. 327/158

FOREIGN PATENT DOCUMENTS

| JP | 11-87512 A | 3/1999 |
| JP | 2001-222573 A | 8/2001 |
| JP | 2001-256271 A | 9/2001 |
| JP | 2002-222230 A | 8/2002 |
| JP | 2002-304434 A | 10/2002 |
| JP | 2004-234618 A | 8/2004 |

* cited by examiner

*Primary Examiner* — David Silver
(74) *Attorney, Agent, or Firm* — Sughrue Mion, PLLC

(57) ABSTRACT

A method of creating a power pin model of an LSI having appropriate analysis accuracy in consideration of information on positions within the LSI is provided. A divided cell size decision unit automatically decides a divided cell size of the LSI from power supply circuit network wire information, transistor structure information, analysis frequency information, size information, and element arrangement information of the LSI as well as from a semiconductor integrated circuit entire power pin model. A model creation unit allocates a model of an active section and a model of an internal capacitance section, including the positional information, within the LSI to the cells at an appropriate proportion, and a model coupling unit couples the models in each cell to create a power pin model of the LSI. Here, the size of each divided cell is determined to be electrically sufficiently smaller than a wavelength corresponding to an upper limit analysis frequency derived from power supply circuit network wire information, transistor structure information, and analysis frequency information.

22 Claims, 18 Drawing Sheets

METHOD, APPARATUS AND PROGRAM FOR CREATING A POWER PIN MODEL OF A SEMICONDUCTOR INTEGRATED CIRCUIT

TECHNICAL FIELD

The present invention relates to a method of creating a power pin model of a semiconductor integrated circuit, and more particularly, to a method, apparatus, and program for creating a power pin model which represents a change in a current which actually flows between power supply pins, in order to simulate a radiation electromagnetic field which is generated in a semiconductor integrated circuit.

BACKGROUND ART

EMI (Electromagnetic Interference: unwanted electromagnetic radiations) is generated from printed circuit boards (hereinafter also referred to as "PCB") mounted in electronic devices. A main cause of the EMI generation may possibly be a high-frequency current on a PCB, particularly, a high-frequency current from a power supply pin of a semiconductor integrated circuit (Large Scale Integrated Circuit, hereinafter also referred to as "LSI"). Accordingly, as countermeasures to the EMI of electronic devices, a high-frequency current flowing through the power supply circuit network layer of a PCB needs to be estimated during a designing stage of the PCB. To this end, a suitable LSI power pin model for use in an EMI simulation is required.

Increasingly larger roles, including an analysis of a current leaking into a signal system, an analysis of the stability of a semiconductor upon signal switching of a power supply voltage, and the like, but not limited to the EMI simulation, have been required for the LSI power pin model.

As shown in FIG. 1, a conventional LSI power pin model is typically of a simple configuration which comprises, between power supply pins of an LSI, active section 91 which is a power supply, and internal capacitance section 92 which is in parallel with active section 91. This power model is adapted to be used by connecting, as part of wires of a distributed power supply circuit network wire models of resistive elements to the upper and lower terminals. This power pin model has a sufficient accuracy because the current flowing from the power supply pin of the LSI to the outside fluctuates due to an external load.

A method of designing such a power pin model is proposed in Patent Literature 1 entitled "Method, Apparatus, and Program for Creating a Semiconductor Integrated Circuit Power pin model of EMI simulation." This literature describes a power pin model in which an active section of a power supply is described as a variable resistor plus a load capacitance, and is configured to control the value of a power supply current of an LSI by the operation of the variable resistor. Patent Literature 2 entitled "Power pin model of a Semiconductor Integrated Circuit for EMI Simulation, and Method of Creating Same" describes a model in which, for an active section of a power supply, a model is used that is described using transistors, and for internal capacitances, a combination of models which depend on the operating state of transistors within an LSI, and models of capacitances that take into account the junction capacitance generated from the structure of the LSI, is used.

However, with the recent greater increase of LSIs in scale and speed, it has been pointed out that the aforementioned simple model is no longer enough. When an LSI is large in size, an active section and an internal capacitance section of the LSI are distributed within the LSI. According to the description of a conventional power supply, this is of a structure where only one power pin model 93 is present centrally in the LSI, as shown in FIG. 2. In this case, although a plurality of packages and wires of PCB exist in the LSI, the differences between currents which flow through the packages cannot be correctly estimated because no consideration is given to positional information on the active section and internal capacitances of the LSI. In addition, a power supply circuit network wire has been represented by simple resistive element 94 alone, as illustrated in the figure; but since a power supply circuit network is increasingly complicated, there arises the need to perform accurate modeling. In the prior art, since analysis frequency in a model is low, even a simple model shown in FIG. 1 exhibits a sufficient accuracy. However, since the frequency of concern is caused to rise owing to the speed-up of LSIs, the conventional simple model is no longer sufficient.

As countermeasures to such a situation, an example of a new semiconductor device model for analyzing noise on power supply and a method of creating the same is described in Patent Literature 3 entitled "Semiconductor Device Model, and Method and Apparatus for Creating the same."

This patent literature concerns a method of creating a semiconductor device model for use in analyzing behaviors of noise on power supply in a semiconductor device. In this method, in order to accurately analyze noise on power supply, models (sub-models) of a power supply circuit network wire, internal capacitances, an internally consumed current, and input/output cells for a semiconductor device to be subjected to noise on power supply analysis are created and these models (sub-models) of the power supply circuit network wire, internal capacitances, internally consumed current, and input/output cells are coupled to thereby create a semiconductor device model for noise on power supply analysis.

In regard to the shape of the model, a power supply circuit network layer of the LSI is divided into a specified number of areas in a reticular pattern. The resistance and inductance of the power supply circuit network wire that are present in each of the divided areas (power supply circuit network lattices) are assigned to a cross-shaped circuit model to create a sub-model of the power supply circuit network wire. Further, models of noise sources and models of internal capacitances are coupled to the center of each power supply circuit network wire sub-model, thus representing actual current operations.

Thus, the capacitance distribution within an LSI can be defined even in a large-scale LSI, thus making it possible to create a more precise model.

However, this method fails to describe how to determine a specific division number. It is thought that an optimal division number can be found by repeating the analysis while changing the division number. However, since there are no specific guidelines for the division number, an excessively large division number would require more analysis time than is necessary, while an excessively small division number would result in a failure to achieve a sufficient degree of analysis accuracy. Furthermore, the repetition of increasing and decreasing the division number to find an optimal division number will require man-hours therefor.

Patent Literature 1: JP-2002-304434A;
Patent Literature 2: JP-2001-222573A;
Patent Literature 3: JP-2004-234618A.

DISCLOSURE OF THE INVENTION

Problems to be Solved by the Invention

In view of the foregoing problems with the prior art, it is an object of the present invention to provide a power pin model of an LSI which takes into account information on positions within the LSI and has adequate analysis accuracy, and to provide a method of creating the same, and a computer program for creating the same.

Means for Solving the Problems

In the present invention, as shown in FIG. 6, for example, an LSI is divided into cells having sides, the length of which are sufficiently shorter than the length of a wavelength corresponding to an upper limit analysis frequency, and an active section and an internal capacitance section of the LSI are added in each cell at an appropriate proportion in accordance with information on layout within the LSI and the size of the cell. A power supply circuit network of each cell is represented with a description in which wiring models with capacitive components are arranged in a reticular pattern. These models of each cell are then coupled to represent a power pin model of the LSI.

Further, if the length of one side of each cell is assumed to be sufficiently shorter than the length of the wavelength corresponding to the upper limit analysis frequency, then a model of an active section and of a model of an internal capacitance section that is to be inserted can be placed within the cell to form together lumped constants. This is because, when an analysis is made on a circuit or a construction having a length that is, in general, sufficiently smaller than the wavelength of an analysis frequency (usually, on the order of $1/10 \sim 1/20$ of the wavelength), it can be deemed that a distributed model is substantially equal to a lumped model.

However, in the present case, since an internal capacitance exists within an LSI chip to form in distribution, the internal capacitance is connected with a power supply circuit network wire. In general, the length of a wavelength corresponding to the upper limit analysis frequency is calculated from the value of wavelength shortening which is calculated from the dielectric constant of the dielectric material of a wire model which forms the power supply circuit network wire. But what should be considered this time is the value of the wavelength shortening on a wire from which is connected with an internal capacitance equal to or greater than the capacitance contained in the power supply circuit network wire. Thus, the value of apparent wavelength shortening is determined in such a situation, and the length of the wavelength corresponding to an apparent upper limit analysis frequency is determined. This value of the apparent wavelength shortening is obtained through a calculation of the value of a wiring capacitance which forms a power supply circuit network of the LSI, the value of an internal capacitance comprising the capacitance of a transistor or the like within the LSI, and the value of a general wavelength shortening. The length of the wavelength corresponding to the apparent upper limit analysis frequency is obtained from this value and the size of the cell is determined.

The power pin model of an LSI created by this method is a model to which information on positions within the LSI is reflected, because the LSI is appropriately divided into cells, each cell having an active section and an internal capacitance section, which are coupled through the model of a power supply circuit network in each cell. In addition, although the active section and the internal capacitance section exist within each cell in a concentrated manner, since the length of one side of each cell is sufficiently smaller than the length of the wavelength corresponding to the upper limit analysis frequency, even when the active section and the internal capacitance section exist in a concentrated manner, characteristics are obtained which are substantially the same as the characteristics when they exist in a distributed manner.

Moreover, since the LSI is divided into cells according to an appropriate size of each cell, the power pin model does not become more complicated than is necessary, and also does not require an additional analysis time. Further, since the appropriate size of the cell can be automatically calculated from information on the LSI and the like, such as a power supply circuit network wiring structure, an internal capacitance value, an upper limit analysis frequency and the like, it is possible to build an apparatus and a program which are capable of automatically creating a model.

According to the present invention, it is possible to readily create a power pin model, the interior of which is divided into cells, which is capable of coping with the speed up of an LSI, which cannot be coped with by a conventional power pin model. Since the power pin model created by this method is essentially created in consideration of the upper limit analysis frequency, the LSI is divided into cells of an appropriate size, and the analysis accuracy is also thought to be appropriate. Further, since the size of the divided cells can be substantially automatically determined, no additional time is required to determine the size of the cell, and more analysis time than is necessary is not taken due to the excessively small cell size. Furthermore, by a mere preparation of input data, a tool can be provided which enables even a user who does not have deep knowledge about a power pin model to readily create a model.

BRIEF DESCRIPTION OF THE DRAWINGS

FIG. 1 is a diagram illustrating a basic configuration of a conventional power pin model within a semiconductor integrated circuit.
FIG. 2 is an example of a description wherein a power supply circuit network model is connected to a conventional power pin model within a semiconductor integrated circuit.
FIG. 3 is a block diagram showing the configuration of a semiconductor integrated circuit power pin model creating apparatus according to a first embodiment of the present invention.
FIG. 4 is a flow chart showing the processing flow performed by the semiconductor integrated circuit power pin model creating apparatus according to the first embodiment.
FIG. 5 is a diagram showing wires in a distributed model, wires in divided concentrated constant models, and the results of a comparison between characteristics of both models.
FIG. 6 is a diagram showing a configuration of a power pin model within a semiconductor integrated circuit created by the semiconductor integrated circuit power pin model creating apparatus according to the first embodiment of the present invention.

FIG. 8 is a diagram showing the configuration of a semiconductor integrated circuit power pin model creating apparatus according to a second embodiment of the present invention.

FIG. 9 is a flow chart showing the processing flow performed by the semiconductor integrated circuit power pin model creating apparatus according to the second embodiment.

FIG. 10 is a diagram showing a configuration of a power pin model within a semiconductor integrated circuit created by the semiconductor integrated circuit power pin model creating apparatus according to the second embodiment of the present invention.

FIG. 11 are diagrams showing an example of a power pin model within a semiconductor integrated circuit created by the semiconductor integrated circuit power pin model creating apparatus according to the second embodiment of the present invention, and an example of a power pin model within a conventional semiconductor integrated circuit.

FIG. 12 is a diagram showing an example of a configuration of a power pin model within a semiconductor integrated circuit having a plurality of active sections, and a model in each cell, created in accordance with a third embodiment of the present invention.

FIG. 13 is a diagram showing an example of a configuration diagram of a power pin model within a semiconductor integrated circuit having a plurality of internal capacitance sections, and a model in each cell, created in accordance with a third embodiment of the present invention.

FIG. 14 is a diagram showing an example of a diagram of a power pin model within a semiconductor integrated circuit having two types of active sections, and a model in each cell, created in accordance with a third embodiment of the present invention, and the waveform of a current of a current source.

FIG. 15 is a diagram showing an example of a diagram of a power pin model within a semiconductor integrated circuit having two types of internal capacitance sections, and a model in each cell, created in accordance with a third embodiment of the present invention.

FIG. 16 is a diagram showing an example of the configuration of a power pin model within a semiconductor integrated circuit having a plurality of power supply systems, and a model in each cell, created in accordance with a fourth embodiment of the present invention.

FIG. 17 a diagram showing an example of the configuration of a power pin model within a semiconductor integrated circuit having two types of power supply systems, and a model in each cell, created in accordance with a fourth embodiment of the present invention, and the waveform of a current of each power supply.

FIG. 18 is a flow chart of a semiconductor integrated circuit power pin model creating program used by a semiconductor integrated circuit power pin model creating apparatus according to a fifth embodiment of the present invention.

FIG. 19 is a diagram showing a configuration of the semiconductor integrated circuit power pin model creating apparatus according to the fifth embodiment of the present invention.

Figure 1:
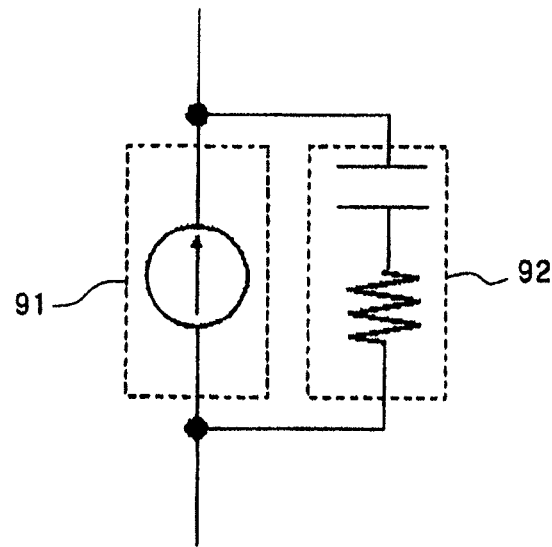
[FIG. 1]
Figure 2:
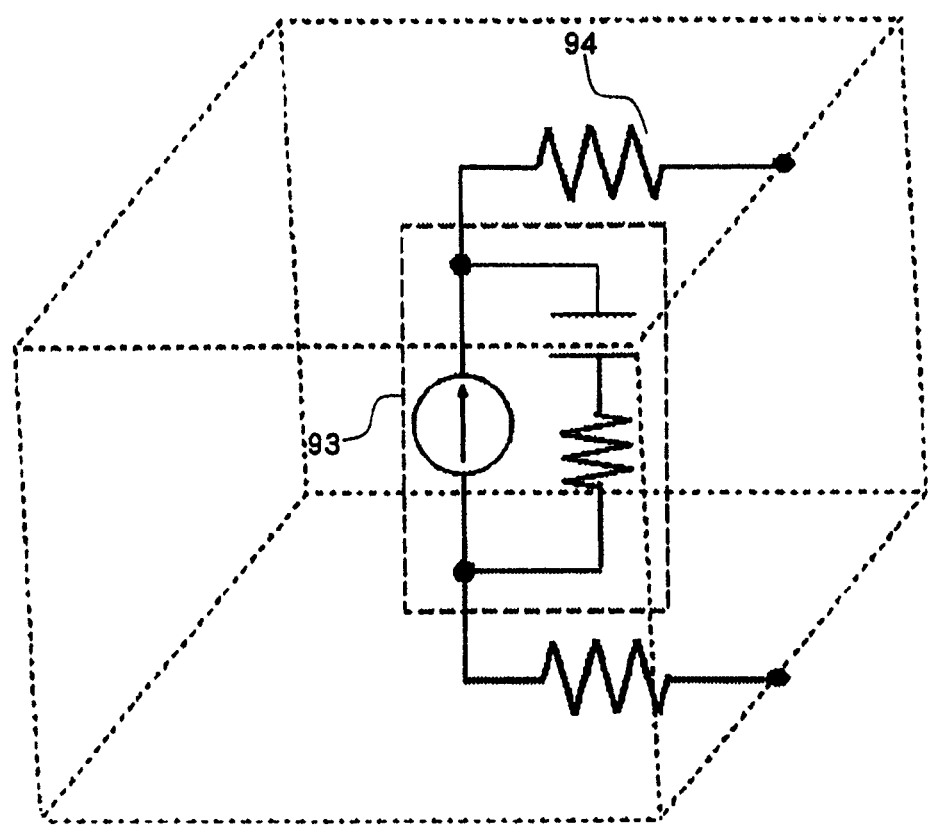
[FIG. 2]

DESCRIPTION OF REFERENCE NUMERALS 1 input data
2 power supply circuit network wiring structure information
3 transistor structure information
4 analysis frequency information
5 size information
6 element arrangement information
7 semiconductor integrated circuit entire power pin model
8 Information on all circuit connections of an LSI
9 LSI layout information
10 power pin model of a semiconductor integrated circuit created in the first embodiment
11 general diagram of a power pin model of a semiconductor integrated circuit having one power supply circuit network layer
12 model of a power supply circuit network in a power pin model of each cell having one power supply circuit network layer
13 a distributed wiring
14 model of an active section in the power pin model of each cell having one power supply circuit network layer
15 a model of an internal capacitance section in a power pin model of each cell having one power supply circuit network layer
16 one example of a power pin model of a semiconductor integrated circuit created in the first embodiment
17 one example of a power pin model of each cell created in the first embodiment
18 one example of a power pin model of a conventional semiconductor integrated circuit
19 one example of position of external terminals of an LSI
20 a power pin model of a semiconductor integrated circuit created in the second embodiment
21 general diagram of a power pin model of a semiconductor integrated circuit having two power supply circuit network layers
22 a model of a power supply circuit network in a power pin model of each cell having two power supply circuit network layers
23 a distributed wiring
24 a model of an active section in a power pin model of each cell having two power supply circuit network layers
25 a model of an internal capacitance section in a power pin model of each cell having two power supply circuit network layers
26 a model of a power supply circuit network in a power pin model of each cell having two power supply circuit network layers
27 one example of a power pin model of a semiconductor integrated circuit created in the second embodiment
28 one example of a power pin model of each cell created in the second embodiment
29 one example of a power pin model of a conventional semiconductor integrated circuit
31 one example of a power pin model of a semiconductor integrated circuit in the third embodiment
32 a model of a power supply circuit network in a power pin model of each cell having two power supply circuit network layers 33 a distributed wiring
34 a model of the active section in a power pin model of each cell having two power supply circuit network layers
34a one of the models of plural active sections in a power pin model of each cell
34b one of the models of plural active sections in a power pin model of each cell
35 a model of the internal capacitance section in a power pin model of each cell having two power supply circuit network layers
35a one of the models of plural internal capacitance sections in a power pin model of each cell
35b one of the models of plural internal capacitance sections in a power pin model of each cell
36 a model of power supply circuit network in a power pin model of each cell having two power supply circuit network layers
37 one example of a power pin model of a semiconductor integrated circuit in the third embodiment
40 a current source
41 a current source
42 a terminal from which current is output from a current source
43 a model of the internal capacitance section in one example of the third embodiment comprised of two types of internal capacitance sections which differ in frequency characteristics
44 an internal capacitance section
45 an internal capacitance section
51 first power supply circuit network layer
52 second power supply circuit network layer
53 third power supply circuit network layer
54 a model of a power supply circuit network in a power pin model of each cell corresponding to the first power supply circuit network layer
55 a model of a power supply circuit network in a power pin model of each cell corresponding to the second power supply circuit network layer
56 a model of a power supply circuit network in a power pin model of each cell corresponding to the third power supply circuit network layer
57 a model of an active section between the first and third power supply circuit network layers in a power pin model of each cell
58 a model of an internal capacitance section between the first and third power supply circuit network layers in a power pin model of each cell
59 a model of an active section between the second and third power supply circuit network layers in a power pin model of each cell
60 a model of the internal capacitance section between the second and third power supply circuit network layers in a power pin model of each cell
61 first power supply circuit network layer in one example of the fourth embodiment
62 second power supply circuit network layer in one example of the fourth embodiment
63 third power supply circuit network layer in one example of the fourth embodiment
64 a model of a power supply circuit network in a power pin model of each cell corresponding to first power supply circuit network layer in one example of the fourth embodiment
65 a model of a power supply circuit network in a power pin model of each cell corresponding to the second power supply circuit network layer in one example of the fourth embodiment
66 a model of a power supply circuit network in a power pin model of each cell corresponding to the third power supply circuit network layer in one example of the fourth embodiment
67 a model of a current source which is the active section between the first and third power supply circuit network layers in one example of the fourth embodiment
68 a model of the internal capacitance section which is the internal capacitance section between the first and third power supply circuit network layers in one example of the fourth embodiment
69 a model of a current source which is the active section between the second and third power supply circuit network layers in one example of the fourth embodiment
70 a model of the internal capacitance section which is an internal capacitance section between the second and third power supply circuit network layers in one example of the fourth embodiment
71 a processing unit
72 a data processing unit
73 a storage device
74 an input device
75 a display device
76 an output device
77 a storage medium
78 a database
79 a model producing program
80 an input data
81 output power pin model of a semiconductor integrated circuit
91 a model of the active section in a conventional power pin model
92 a model of the internal capacitance section in a conventional power pin model
93 a conventional power pin model
94 a power supply circuit network wiring model represented by a resistive element
100, 200 an input unit
110, 210 a sub-cell size decision unit
120, 220 a model creation unit
130, 230 a model coupling unit
140, 240 a storage unit
150, 250 an output unit
111-116, 121, 122, 131 step
211-216, 221, 222, 231 step
301-326 step

BEST MODE FOR CARRYING OUT THE INVENTION

Embodiments of the present invention will now be described with reference to the drawings.

First Embodiment

In the present embodiment, a power pin model for an LSI having only one power supply circuit network layer is created. An LSI usually has two or more types of power supplies, but in this case, it is assumed that one of the two types of power supplies is connected to ground. Active sections and internal capacitances in the LSI thus exist between the power supply circuit network layer and ground.

Figure 3:
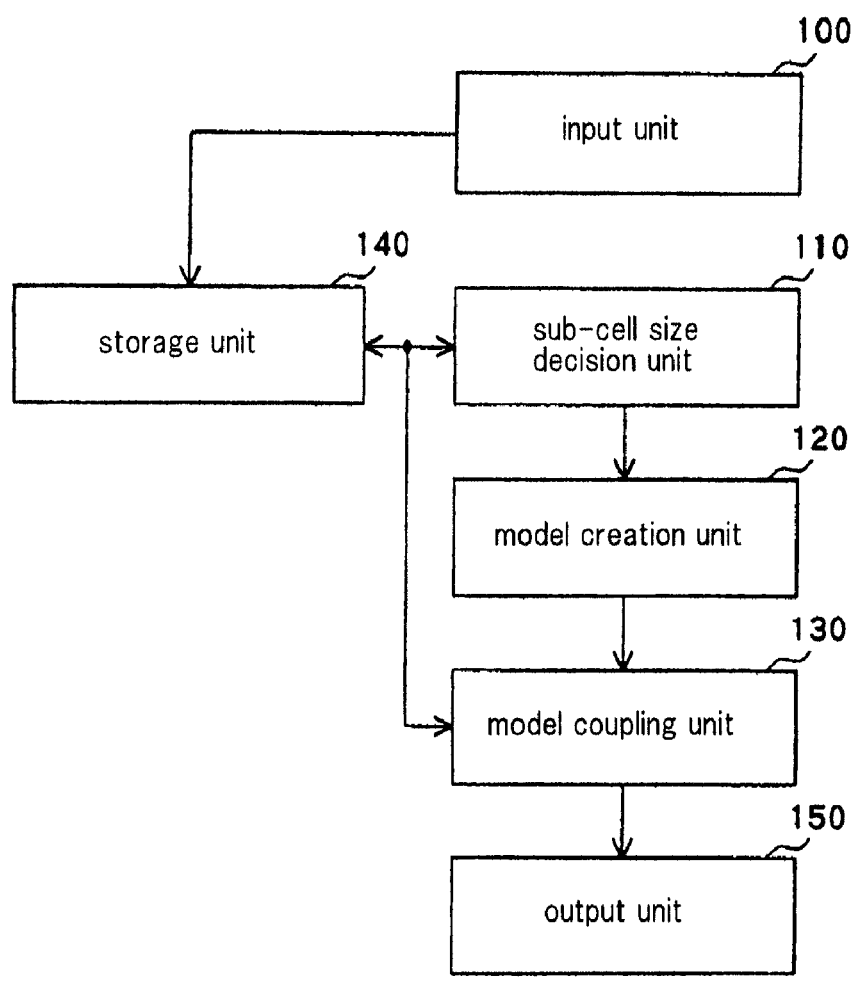
[FIG. 3]

FIG. 3 is a diagram showing the configuration of a semiconductor integrated circuit power pin model creating apparatus of this embodiment. The apparatus comprises input unit 100 for entering data; divided cell size decision unit 110 for deciding the size of divided cells of an LSI; model creation unit 120 for creating a model of a power supply circuit network, a model of an active section, and a model of an internal capacitance section for each divided cell; model coupling unit 130 for coupling models for each cell to provide a power pin model of the LSI; storage unit 140 for storing data entered from input unit 100 and temporarily storing data processed halfway in each unit 110-130; and output unit 150 such as a printer, a display or the like, for outputting a created power pin model.

Figure 4:
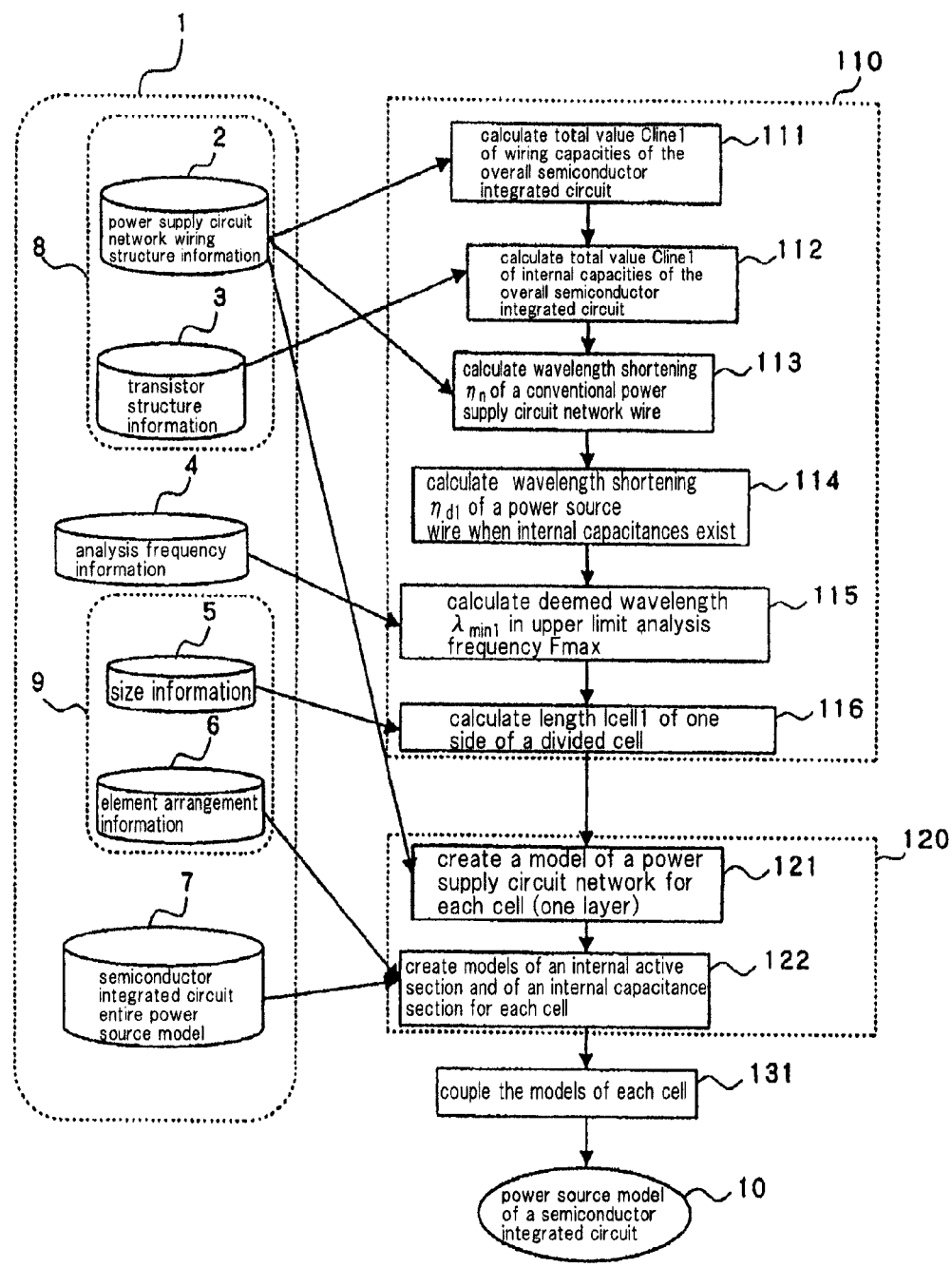
[FIG. 4]

FIG. 4 shows information which is entered from input unit 100 and which is required when a power pin model is created, and the processing flow performed in divided cell size decision unit 110, model creation unit 120, and model coupling unit 130. As shown on the left side of FIG. 4, Information required to create a power pin model includes: power supply circuit network wiring structure information 2 of a power supply circuit network wiring structure information LSI such as the length, width, and thickness of a power supply circuit network wire, the type of a dielectric material, and the like; transistor structure information 3 including a gate width, a gate length, the surface area of a diffusion layer, and the like, of transistors which form an internal capacitance section; analysis frequency information 4 which is information of an upper limit frequency when a model is used; size information 5 which is the chip size of the LSI; element arrangement information 6 which is information of the layout of an active section and an internal capacitance of the LSI; and semiconductor integrated circuit entire power pin model 7 which is a power pin model according to a conventional description, which is made up of active sections and internal capacitance sections of the overall LSI. From these pieces of information, a power pin model which is divided into cells of an appropriate size can be created. All circuit connection information 8 of LSI exists as data which includes both power supply circuit network wiring structure information 2 and transistor structure information 3, and LSI layout information 9 exists as data which includes both size information 5 and element arrangement information 6. Therefore, they may be used as input data. Transistor structure information 3 is information for determining an LSI internal capacitance, and may be data of an actual capacitance model such as a capacitance cell, rather than a description of transistors. Semiconductor integrated circuit entire power pin model 7, which is a conventional power pin model, is described using active sections and internal capacitance sections in the overall LSI, which are extracted from all circuit connection information 8 of the LSI. By way of example, they have been previously created in accordance with a method described in JP-2001-222573A or JP-2002-304434A. As occasion demands, they may also be created from input data before being input to divided cell size decision unit 110. Further, although the description of semiconductor integrated circuit entire power pin model 7 is applied to the description of a model in each cell, the description may also be converted, such as converting from the model of a transistor description to the model of a current source description, and the like.

Divided cell size decision unit 110 comprises steps 111-116.

At step 111, total value Cline1 of wiring capacitances between power supply circuit network wires in a power supply circuit network layer of the LSI and ground is calculated from power supply circuit network wiring structure information 2.

At step 112, total value Cin1 of internal capacitances of the LSI added between the power supply circuit network layer and ground is determined from transistor structure information 3.

At step 113, value $\eta n$ of a wavelength shortening of a power supply circuit network wire on the power supply circuit network layer is determined from power supply circuit network wiring structure information 2. This value is automatically calculated from dielectric constant $\in r$ of a dielectric layer of the power supply circuit network wire by the following equation:

[Equation 1]

$$\eta_n = 1/\sqrt{\in_r} \quad (1)$$

At step 114, from the determined values of Cline1, Cin1, and $\eta n$, value $\eta d1$ of a wavelength shortening is determined for determining a wavelength when an internal capacitance is connected with a power supply circuit network wire. Here, the fact that an internal capacitance is connected with a power supply circuit network wire may be taken to mean an equivalent increase in the capacitance of the power supply circuit network wire, and put it another way, to mean an equivalent increase in the dielectric constant of a dielectric layer of the power supply circuit network wire. Since an equivalent dielectric constant can thus be determined from the values of Cline1 and Cin1, value $\eta d1$ of an apparent wavelength shortening can be determined from Equation (2):

[Equation 2]

$$\eta_{d1} = \frac{\eta_n}{\sqrt{(Cline1 + Cin1)/Cline1}} \quad (2)$$

At step 115, upper limit frequency Fmax of analysis is derived from analysis frequency information 4, and deemed wavelength $\lambda\min1$ corresponding to Fmax is determined by Equation (3) using the value $\eta d1$ of the wavelength shortening calculated by Equation (2) when the wavelength in vacuum corresponding to Fmax is $\lambda\min0$.

$$\lambda\min1 = \eta d1 \times \min0 \quad (3)$$

In this case, the value of $\lambda\min0$ corresponding to the value of Fmax may be included in analysis frequency information 4, or can be held as a database of a tool.

Here, when Equations (1)-(3) are combined into one equation and the values of $\eta \min0$, Cline1, Clin1, and $\eta n$ are used, $\lambda\min1$ is represented as Equation (4):

$$\lambda_{min1} = \frac{\eta_n * \lambda_{min0}}{\sqrt{(Cline1 + Cin1)/Cline1}} \quad (4)$$

Further, at step 116, the length of length lcell1 of one side of a divided cell of the LSI is determined from the value of $\lambda\min1$ which is determined from size information 5. Here, "Introduction to EMC" by Clayton R. Paul, the translation of which is supervised by Akihisa Sakurai (Mimatsu Data System, first edition published on Feb. 29, 1996), describes on page 22 that the Kirchhoff's voltage/current law can be applied to concentrated constant models of elements only in limited cases where circuits are electrically small in size. That is, elements of a power pin model such as a current source and an internal capacitance exist as lumped models, but in an actual LSI, those corresponding to them exist such that they are distributed on a plane. When an LSI is represented such that models are connected with a certain point in a concentrated manner, the respective models must have electrically small distances. Therefore, when elements such as a current source and an internal capacitance exist while dangling from each center of a divided cell of an LSI, the distance between the respective centers is only required to be sufficiently small, that is, the length of one side of each divided cell is only required to be electrically sufficiently small. Thus, a division size may be determined such that the distance between models, i.e., the length of one side of each divided cell is sufficiently smaller than wavelength $\lambda$min1 at the maximum frequency in question. Accordingly, length lcell1 of one side of the divided cell of the LSI is determined such that the relationship of Equation (5) is satisfied, and the LSI chip can be exactly divided into the cells having length lcell1 that is an integer.

$$l\text{cell1} \leq \lambda\text{min1}/n \quad (5)$$

Here, the value of n is an arbitrary value which makes lcell1 sufficiently smaller than $\lambda$min1. The aforementioned document "Introduction to EMC" includes on pages 19-20 the description to the effect that an electronic circuit or a construction which radiates electromagnetic waves is said to be electrically small if its maximum physical size L is sufficiently smaller than wavelength $\lambda$, i.e., $L \ll \lambda$, and the circuit and the electromagnetic construction are assumed to be electrically small if the relationship:

$$L < \lambda < 10 \quad (6)$$

is satisfied, though this is only one approximate criterion. When the value of n is set to a value greater than 10, based on the above description, even if respective lumped power pin models exist at a distance of lcell1, this does not electrically cause any problems and it can be said that an actual state in an LSI can be equivalently represented. Therefore, a guide for the value of n in Equation (5) is 10 or more. If lcell1 is sufficiently smaller than $\lambda$max1, and a calculation time does not increase much, then n preferably takes a value in a range of 10 to 20. However, this value of n is not necessarily limited to the above value, if necessary, from a tradeoff of the accuracy of analysis, a calculation time and the like.

Figure 5:
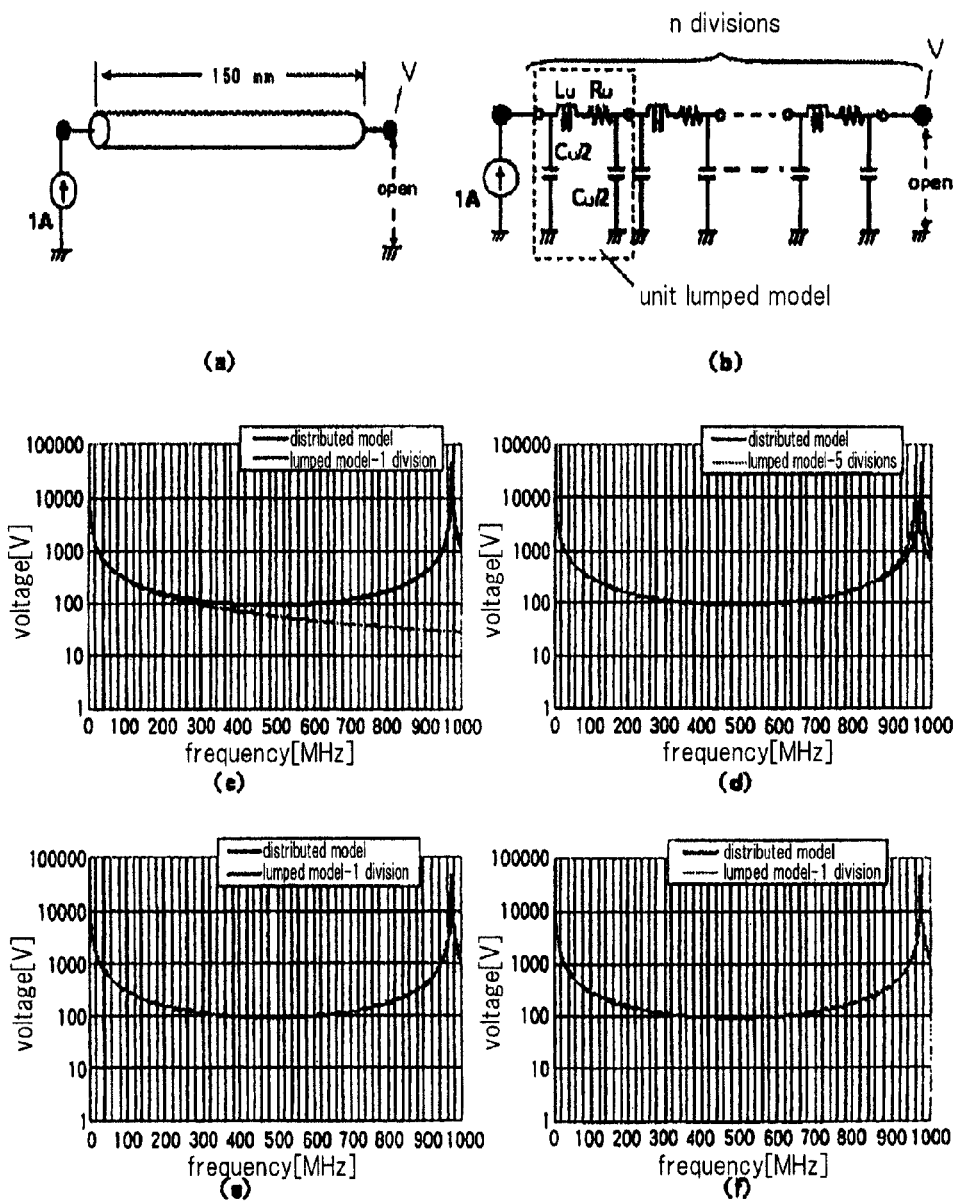
[FIG. 5]

The validity for the value n will now be specifically studied for wires which use a distributed model and a lumped model with reference to the result of an analysis made using SPICE (Simulation Program with Integrated Circuit Emphasis). FIG. 5(a) shows an analysis circuit having a transmission line with length lt=150 mm, one end of which is attached to an AC current source of current value 1A, and the other end of which is opened, whereby the frequency characteristic of a voltage at the open end is determined. The transmission path is described using a distributed constant, and a model is created as a micro-strip line on a dielectric layer with specific dielectric constant $\in$ra=4. Parameters L, C, and R of this transmission line per unit length are determined to be L=3.161×10$^{-10}$ [H/mm], C=3.711×10$^{-14}$[F/mm], R=2.255×10$^{-3}$[$\Omega$/mm], respectively. On the other hand, FIG. 5(b) re-describes the circuit of FIG. 5(a) with models using lumped constants, where the unit lumped model composed of L, C, and R elements (each having values of Lu, Cu, and Ru) are connected in series together to constitute an equivalent circuit for the transmission path. The value of each element in the unit lumped model is calculated by dividing the respective values of L, C, and R of the overall transmission path by the number of stages of the unit lumped model. When a wavelength corresponding to the aforementioned analysis frequency and an electric length of the circuit are considered, a determination can be made as to how many stages of the unit lumped model are required to represent the transmission path of distributed constants. When it is assumed that the frequency under analysis is up to 1 GHz, wavelength $\lambda$tl1 g at that time is 300 mm in vacuum, and non-dielectric constant $\in$ra=4, so that $\lambda$tl1 g is calculated by:

$$\lambda_{tl1g} = 300 \ast 1/\sqrt{\in_{ra}} = 300/2 = 150 \text{ [mm]} \quad \text{[Equation 4]}$$

Transmission path length lt is thus equal to the wavelength at 1 GHz, so that if the number of the unit lumped model is more than ten stages, according to Equation (6), the unit lumped model can be approximated to an electric length sufficiently smaller than the wavelength at 1 GHz. Therefore, the transmission path can be represented by an equivalent circuit using lumped constants, as well. FIGS. 5(c)-5(f) are graphs showing the comparisons between the results of analyses on the model of FIG. 5(a) using distributed constants and the results of analyses (four models) of FIG. 5(b) using lumped constants. The number of stages of the unit lumped model (i.e., the number of divided transmission paths) is one (i.e., not divided) in FIG. 5(c); five in FIG. 5(d); ten in FIG. 5(e); and 20 in FIG. 5(f). In this case, if the number of stages of the unit lumped model in FIG. 5(e) is set to ten, for example, then the length of the unit lumped model corresponds to 150/10=15 mm, and values Lu, Cu, and Ru of the respective elements in the unit lumped model are:

$$Lu = 3.161 \times 10^{-10} \times 15 = 4.7415 \times 10^{-9} \text{ [H]}$$

$$Cu = 3.711 \times 10^{-14} \times 15 = 5.5665 \times 10^{-13} \text{ [F]}$$

$$Ru = 2.255 \times 10^{-3} \times 15 = 4.7415 \times 10^{-2} \text{ [}\Omega\text{]}$$

When the number of stages is a number other than ten, Lu, Cu, and Ru may take values corresponding thereto. The comparison between the results of FIGS. 5(c)-5(f) shows that the results are completely different in FIG. 5(c) where the number of stages of the unit lumped model is one (i.e., not divided), and even in FIG. 5(d) where the number of stages is five, and the peak frequencies and the values appearing at 900 MHz or higher are largely different. Therefore, it cannot be said that the lumped model is equivalent to the distributed model. However, when the number of stages is set to ten, as shown in FIG. 5(e), the difference is only 0.5% in the peak frequency appearing at 900 MHz or higher and approximately 2% in the value as well, so that it can be said that the characteristics substantially match. When the number of stages is set to 20, as shown in FIG. 5(f), the characteristics further match, where the difference in frequency at the peak is 0.1%, and the difference in value is approximately 0.6% as well. Accordingly, it may be appropriate that the number of stages of the unit lumped model, i.e., a number by which the transmission path is divided, is larger than ten. Thus, it may be appropriate that the value of n in Equation (6) is a value larger than ten and in the range of 10 to 20.

Processing of model creation unit 120 comprises two steps 121, 122.

Figure 6:
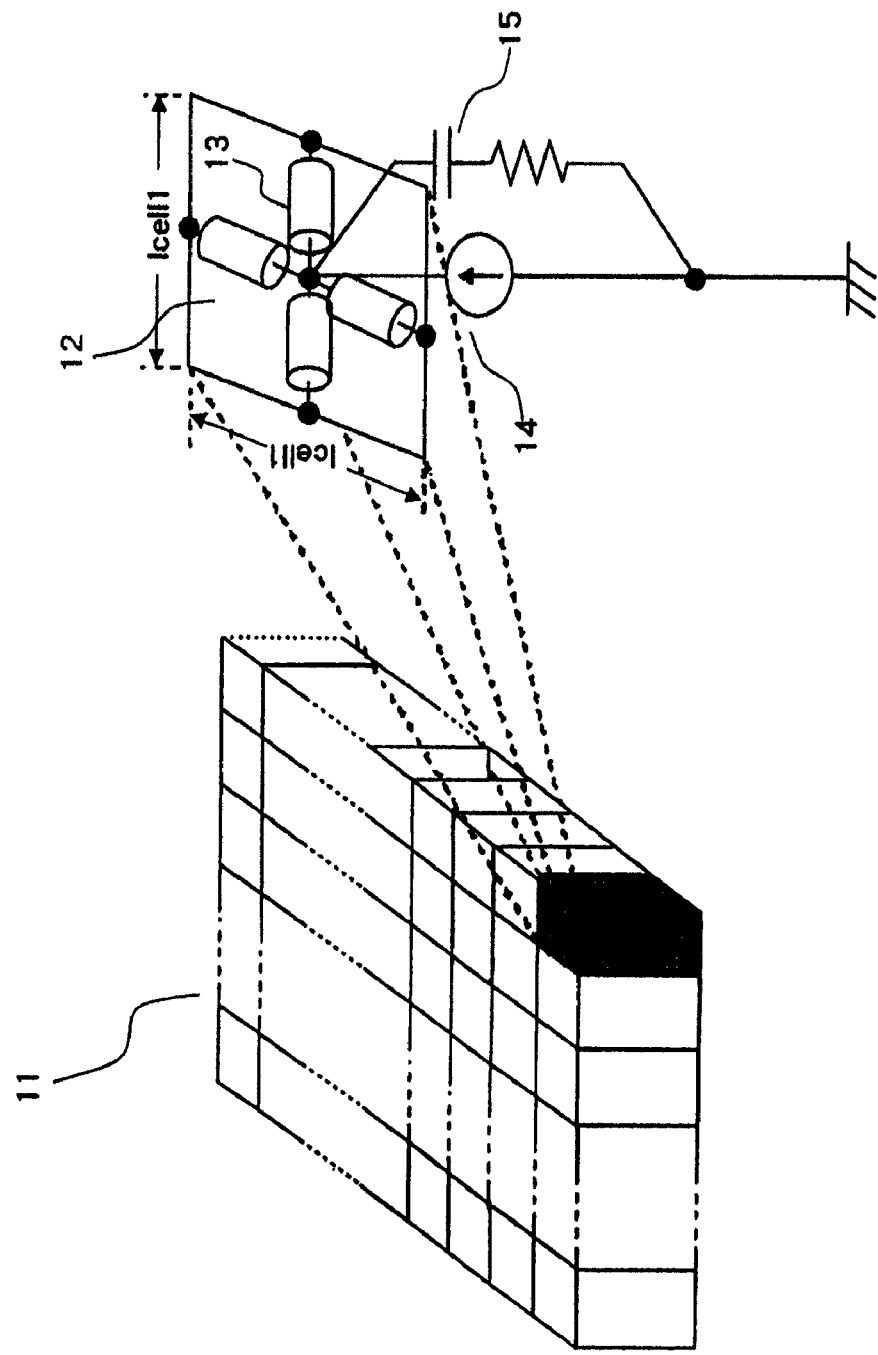
[FIG. 6]

At step 121, a model of a power supply circuit network for a cell is created in accordance with the size of the cell determined from power supply circuit network wiring structure information 2 and the value of lcell1 derived by divided cell size decision unit 110. The model of the power supply circuit network is of a configuration wherein it comprises wiring models which exist in a reticular pattern, a terminal connected to an active section and to an internal capacitance section at the center of the cell, and terminals for coupling with adjacent cells on the sides. In FIG. 6, model 12 for the power supply circuit network is of a cross-like shape, and comprises terminals to be coupled with other cells which are positioned at the center of the sides; but another shape may also be selected. Further, although a distributed model is used for model 13 for a wire, a lumped model may also be selected, which model is described using an inductance, a resistance, and a capacitance.

At step 122, model 14 of an internal active section and model 15 of an internal capacitance section are inserted into each cell at an appropriate proportion in accordance with the size of the cell and the layout information on elements within the LSI, determined from element arrangement information 6, semiconductor integrated circuit entire power pin model 7, and the value of lcell1 derived by divided cell size decision unit 110, and models 14 and 15 are connected to the model of the power supply circuit network. The proportions of each size of model 14 of the internal active section and model 15 of the internal capacitance section in FIG. 4 to the size of a model of the overall LSI created by divided cell size decision unit 110 are values that are conceivable from the size of the cell, layout information and the like. In FIG. 6, a model of a current source is used for the active section, and a lumped model is used for the internal capacitance section. Accordingly, a model of each cell can be automatically created by multiplying the size of a model of the overall LSI by the proportion. Even if another model is used such as a transistor description, a model of each cell can be created from the model of the overall LSI. As well, use of element arrangement information 6 also makes it possible that the proportion of the size of model of the internal active section to the size of a model of the overall LSI is set equal to the proportion of the size of the model of the internal capacitance to the size of a model of the overall LSI.

Processing of model coupling unit 130 comprises step 131.

At step 131, model coupling unit 130 couples the model of each cell created by model creation unit 120 to respective external cells through connection terminals, and derives power pin model 10 for the overall LSI which has only one power supply circuit network layer. The coupling terminals on the sides of each outermost cell may be single or plural coupling terminals for connection with the outside of the LSI, or otherwise no connection is carried out.

In this way, power pin model 10 for the overall LSI having one power supply circuit network layer can be created from power supply circuit network wiring structure information 2, transistor structure information 3, analysis frequency information 4, size information 5, element arrangement information 6, and semiconductor integrated circuit entire power pin model 7. Even if model 14 of the active section and model 15 of the internal capacitance section exist in a concentrated manner, their distances present electrically sufficiently smaller values than the wavelength corresponding to the upper limit of the analysis frequency calculated using the value of the wavelength shortening when the capacitance is connected with a wire. Therefore, a power pin model 10 when the model of the active section and the model of the internal capacitance section exist in a concentrated manner can be deemed to have an analysis accuracy equivalent to that when the active section and internal capacitance section are distributed within the LSI. Also, since the LSI is divided into cells of an appropriate size, the active section and the internal capacitance are allocated to each cell at an appropriate proportion in consideration of the size and layout information, and they are coupled through the model of a power supply circuit network, the resulting model is a model that takes positional information into consideration and that can sufficiently cope with increasingly higher analysis frequencies.

Processing performed at each of the foregoing steps will now be described using specific values.

First, input data 2-7 are prepared. At this time, assume that analysis frequency information 4 describes the upper limit analysis frequency of 1 GHz, and wavelength λ 1 GHz0 corresponding thereto of 300 [mm] in vacuum; size information 5 describes the LSI chip size of 5 [mm]×5 [mm]; and semiconductor integrated circuit entire power pin model 7 describes the active section using a model of a current source and the internal capacitance section using a single lumped capacitive element, the value of the amplitude of the current source being 1 [A], and the internal capacitance being 3500 [pF]. Also assume that data required to create models for other input data 2, 3 and 6 have been prepared.

At step 111, total value Cline1 of wiring capacitances is calculated from power supply circuit network wiring structure information 2. Assume herein that Cline1=50 [pF] is calculated.

At step 112, total value Cin1 of internal capacitances is calculated from transistor structure information 3. Assume herein that Cin1=10000 [pF] is calculated. This value is equal to the value of the internal capacitance section of semiconductor integrated circuit entire power pin model 7, because the internal capacitance section is described using a capacitive element. Since the internal capacitance section may also be described using transistors and the like, the values must be calculated again at step 112.

At step 113, value η n of a wavelength shortening of the power supply circuit network wire is calculated from power supply circuit network wiring structure information 2. Assuming herein that dielectric constant ∈r of the dielectric material in the wire which constitutes the power supply circuit network wire, is four, then η n is calculated by:

$$\eta_n 1/\sqrt{4} = 0.5 \quad \text{[Equation 5]}$$

from Equation (1).

At step 114, the value η d1 of the wavelength shortening of the power supply circuit network wire when internal capacitance exists, is calculated. From Equation (2),

[Equation 6]
$$\eta_{d1} = \frac{0.5}{\sqrt{(50+10000)/50}} \approx 0.0353$$

is derived.

At step 115, value λmin1 of the apparent wavelength at upper limit analysis frequency Fmax is calculated from analysis frequency information 4. Here, since wavelength λ 1 GHz0 is 300 [mm] at 1 GHz in vacuum, $$\lambda\text{min}1 = 0.0353 \times 300 \approx 10.6 \text{ [mm]}$$

is derived from Equation (3).

At step 116, length lcell1 of one side of the divided cell is determined from the LSI layout information. Since the divided size must be determined such that the distance between power pin models connected with the center of each divided cell, i.e., the length of one side of each divided cell, must be a length sufficiently smaller than apparent wavelength λmin1, $$l\text{cell}1 \leq 10.6/10 = 1.06 \text{ [mm]}$$

is obtained when n=10 is selected in Equation (5) as a value which sufficiently satisfies the condition. Here, the LSI has a chip size of 5 [mm]×5 [mm], and if the value is selected as lcell1=1 [mm] which satisfies the foregoing equation and allows the LSI to be divided into cells with lcell1 having the value of an integer, then an electrically appropriate model can be created without performing more finer divisions than is necessary. In this case, since the cell has the size of 1 [mm]×1 [mm], the LSI is made up of 25 divided cells.

At step 121, a model of a power supply circuit network in each cell is created from power supply circuit network wiring structure information 2 and the value of lcell1. Here, similar to the example shown in FIG. 6, a model of a wire comprises models described using distributed constants, created with the value of ∈r=4, and arranged in a cross-like manner.

At step 122, a power pin model of each cell is created from element arrangement information 6, semiconductor integrated circuit entire power pin model 7, and the value of lcell1, and is connected to the model of the power supply circuit network created at step 121. Assuming from the layout information that the active section and the internal capacitance of the LSI are distributed on the LSI at an equal proportion to the entire of LSI, then the proportions of the active section and of the internal capacitance in each cell to the entire of LSI are ½s. Accordingly, the value of the amplitude of the current source and the capacitance value in each cell are calculated to be 1/25=0.04 [A]; 10000/25=400 [pF], respectively.

Finally, at step 131, the power pin models of the respective cells created by model creation unit 120 are coupled to create power pin model 10 for the LSI. Created power pin model 10 is shown in FIG. 7(a).

A conventional power pin model for a similar LSI is shown in FIG. 7(b). The comparison between the presently proposed model and the conventional power model shows that the former has improved its analysis accuracy and coped with higher frequencies, as compared with the latter. If there exist pins, for example, at 24 locations on an actual layout, then in the model shown in FIG. 7(a), external terminals exist in correspondence thereto (at sufficiently close locations), an active section and an internal capacitance corresponding to the area of the cell, exist at a distance electrically sufficiently smaller than the wavelength of the analysis frequency (~1 GHz) from the terminals, and a model of a power supply circuit network corresponding to the distance exists. Therefore, the result of analysis is obtained which corresponds to the analysis frequency and which sufficiently reflects positional information. However, the model of FIG. 7(b) is a model in which, only one resistive element (a wiring model may be used) is connected from the center of the LSI to an external terminal. It cannot be said that the active section and the internal capacitance which is connected with an external terminal and from the center of the LSI are spaced at a distance electrically sufficiently smaller than the wavelength of the analysis frequency (~1 GHz). In this case, it is conceivable that the characteristics may vary with the analysis frequency approaching the upper limit of 1 GHz, as is the case with FIG. 5(c) where there are a small number (one or five) of stages (the number of divided lines) of the unit lumped model.

Further, the number 5×5 of divisions in the present model is due to the fact that the value of n in Equation (5) is chosen to be 10. However, a creator may change the value of n for purposes of improving the analysis accuracy, bringing the positions of external terminals closer to the actual pins, and the like. For example, if n=20, then $$lcell1 \leq 10.6/20 = 0.53 \text{ [mm]}$$

in the aforementioned example, an appropriate value is lcell1=0.5 [mm], and the LSI is divided into 10×10, i.e., 100. However, it is essential not to unduly increase the number of divisions, but to select an appropriate number of divisions such that sufficient analysis accuracy for the upper limit analysis frequency is obtained and the analysis time is restrained as much as possible. There is an approximation described in Equation (6) as a criterion for the selection, but all cases are not limited thereto.

Second Embodiment

In this embodiment, a description will be made of a method of creating a power pin model of a structure of an LSI having two power supply circuit network layers. In this case, an active section and an internal capacitance of the LSI exist between two types of power supply circuit network layers. Further, wires which constitute the power supply circuit network layers have respective capacitive components between them and ground. Here, the two power supply circuit network layers can be equivalently regarded as one power supply circuit network layer as shown in the first embodiment. In this case, a wiring capacitive component existing between the wire of the equivalent one power supply circuit network layer and ground is the total of the wiring capacitive components which exist between wires of the two power supply circuit network layers and ground. Accordingly, based on this idea, a power pin model of a structure having two power supply circuit network layers is created by the method as shown in the first embodiment.

Figure 8:
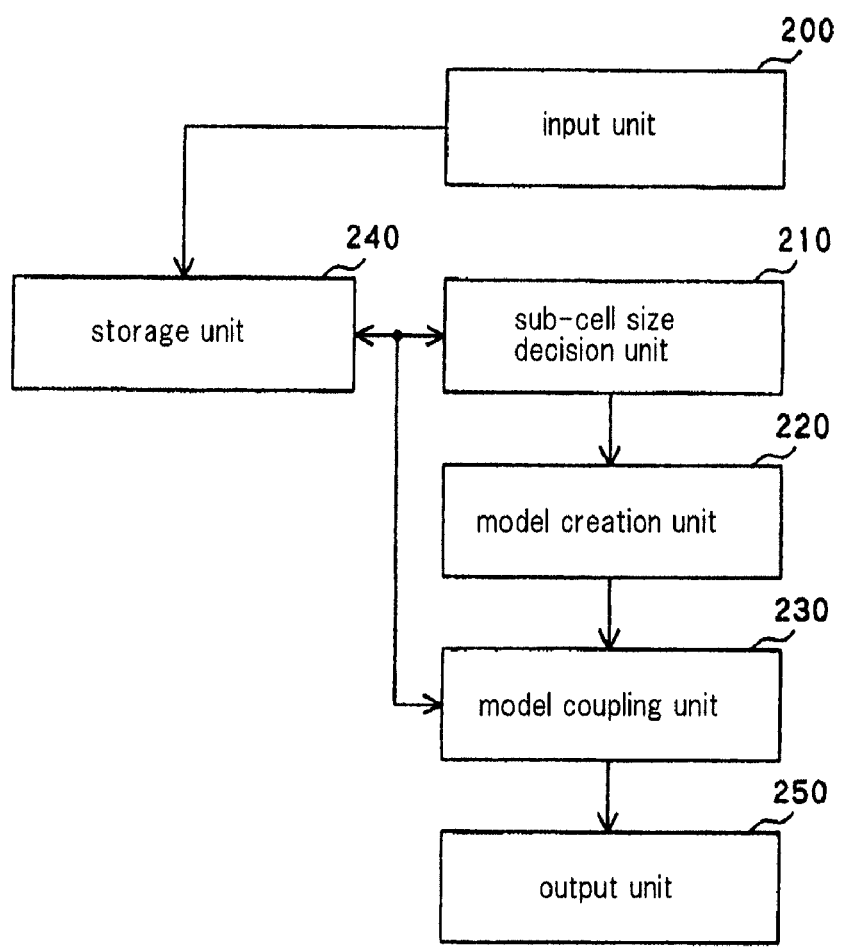
[FIG. 8]

FIG. 8 is a diagram showing the configuration of a semiconductor integrated circuit power pin model creating apparatus according to the second embodiment of the present invention. Similar to the first embodiment, this apparatus comprises input unit 200 for entering data; divided cell size decision unit 210 for deciding the size of divided cells of an LSI; model creation unit 220 for creating a model of a power supply circuit network, a model of an active section, and a model of an internal capacitance section for each divided cell; model coupling unit 230 for coupling models for each cell to output a power pin model of the LSI; storage unit 240 for storing data entered from input unit 200 and temporarily holding data processed halfway in each unit 210-230; and output unit 250 for outputting a created power pin model, such as a printer, a display or the like.

Figure 9:
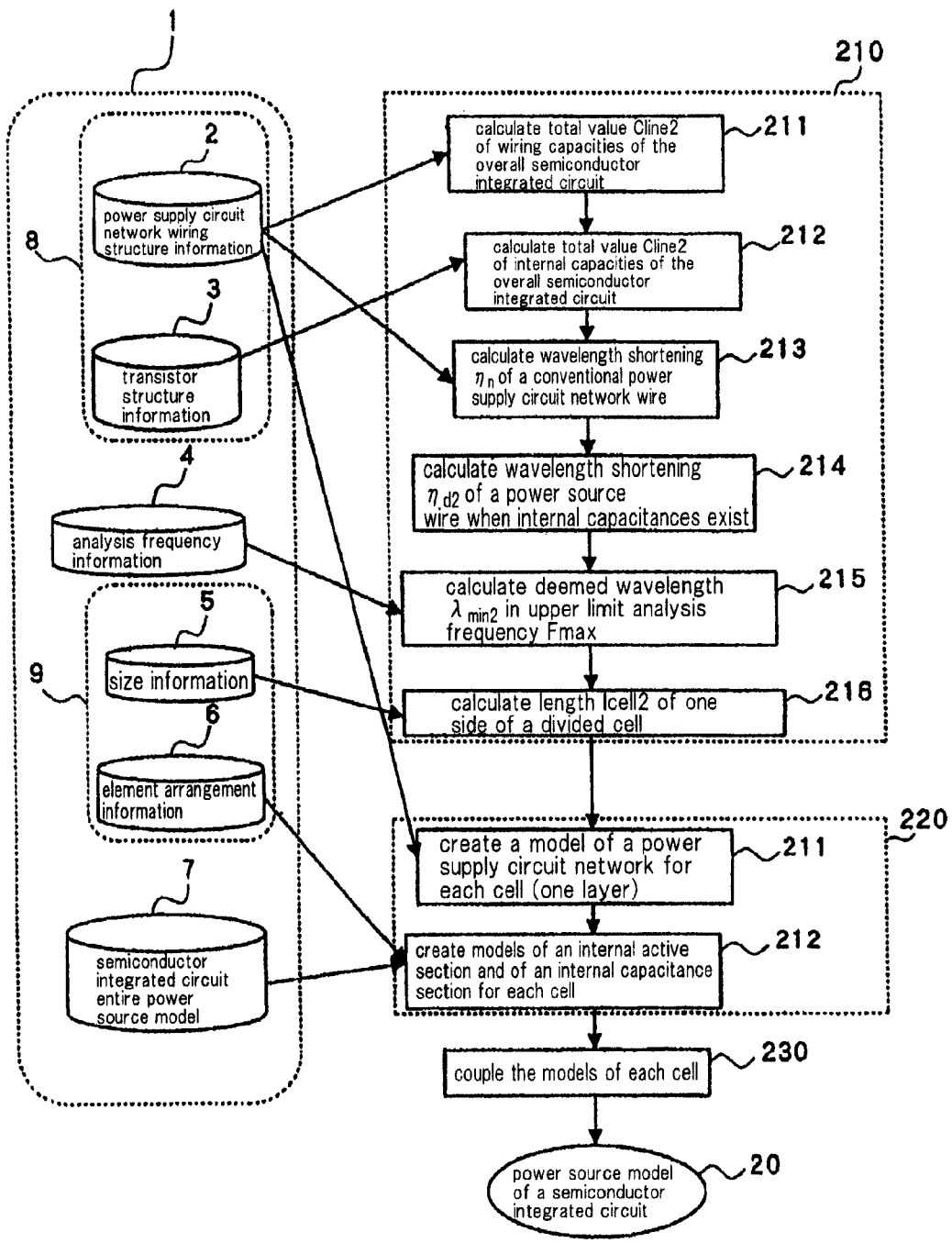
[FIG. 9]

FIG. 9 shows information entered from input unit 200, which is required when a power pin model is created, and the processing flow performed in divided cell size decision unit 210, model creation unit 220, and model coupling unit 230. As shown on the left-hand side of FIG. 9, similar to the first embodiment, information required to create a power pin model includes, power supply circuit network wiring structure information 2 of a power supply circuit network wiring structure information LSI such as the length, width, and thickness of a power supply circuit network wire, the type of a dielectric material, and the like; transistor structure information 3 including a gate width, a gate length, the surface area of a diffusion layer, and the like, of transistors which constitute an internal capacitance section; analysis frequency information 4 which is information on an upper limit frequency when a model is used; size information 5 which is the chip size of the LSI; element arrangement information 6 which is layout information on an active section and an internal capacitance of the LSI; and semiconductor integrated circuit entire power pin model 7 which is a power pin model in a conventional description, made up of active sections and internal capacitance sections of the overall LSI. A power pin model divided into cells of an appropriate size can be created from these pieces of information. Similar to the first embodiment, all circuit connection information 8 of LSI exists as data which includes both power supply circuit network wiring structure information 2 and transistor structure information 3, and LSI layout information 9 exists as data which includes both size information 5 and element arrangement information

6, so that they can be used as input data. Further, similar to the first embodiment, transistor structure information 3 may be replaced with data of an actual capacitance model such as a capacitance cell, not with a description of transistors. Furthermore, similar to the first embodiment, semiconductor integrated circuit entire power pin model 7, which is a conventional power pin model, is described with active sections and internal capacitance sections in the overall LSI, which are extracted from all circuit connection information 8 of the LSI, and can also be created from input data prior to processing in divided cell size decision unit 14, as needed. Moreover, similar to the first embodiment, the description of semiconductor integrated circuit entire power pin model 7 is applied to a description of a model in each cell. But the description my also be converted.

Processing performed in divided cell size decision unit 210 comprises steps 211-216.

At step 211, total value Cline2 of wiring capacitances between power supply circuit network wires in the power supply circuit network layers of the LSI and ground is calculated from power supply circuit network wiring structure information 2. Since there are two power supply circuit network layers, the value of Cline2 is the sum of the values between both layers and ground.

At step 212, total value Cin2 of internal capacitances of the LSI added between the two power supply circuit network layers is determined from transistor structure information 3.

At step 213, value η n of a wavelength shortening of a power supply circuit network wire on the power supply circuit network layer is determined from power supply circuit network wiring structure information 2. This value is automatically calculated from dielectric constant ∈r of the dielectric layer of the power supply circuit network wire by the following equation:

[Equation 7]

$$\eta_n = 1/\sqrt{\in_r} \tag{1}$$

The value of η n is uniquely determined because, although there are two power supply circuit network layers, the type of the dielectric material which constitutes the power supply circuit network wires usually remains unchanged. If there are a plurality of types of dielectric materials, then the one having the largest value of dielectric constant ∈r among them is used, and η n is calculated by Equation (1).

At step 214, from the determined values of Cline2, Cin2, and ηn, value η d2 of a wavelength shortening is determined so as to determine a wavelength when an internal capacitance exists between power supply circuit network wires. As mentioned in the first embodiment as well, an internal capacitance existing between power supply circuit network wires can be considered to be an equivalent increase in the capacitance of the power supply circuit network wire, and to put it another way, can be considered to be an equivalent increase in the dielectric constant of dielectric layers in the power supply circuit network wires. An equivalent dielectric constant can thus be determined from the values of Cline2 and Cin2, and therefore value η d2 of an apparent wavelength shortening can be determined from Equation (7).

[Equation 8]

$$\eta_{d2} = \frac{\eta_n}{\sqrt{(Cline2 + Cin2)/Cline2}} \tag{7}$$

At step 215, upper limit analysis frequency Fmax is derived from analysis frequency information 4, and deemed wavelength λmin2 corresponding to Fmax is determined by Equation (8) using the value η d2 of the wavelength shortening calculated by Equation (7) when the wavelength in vacuum corresponding to Fmax is set to λmin0.

$$\lambda min2 = \eta d2 \times \lambda min0 \tag{8}$$

At this time, similar to the first embodiment, the value of λmin0 corresponding to the value of Fmax may be contained in analysis frequency information 4, or alternatively can be held as a database of a tool.

Here, when Equations (1), (7), and (8) are combined into one equation and the values of λmin0, Cline2, Clin2, and η n are used, then λmin2 is represented in Equation (9):

[Equation 9]

$$\lambda_{min2} = \frac{\eta_n * \lambda_{min0}}{\sqrt{(Cline2 + Cin2)/Cline2}} \tag{9}$$

Further, at step 216, the value of length lcell2 of one side of a divided cell of the LSI is determined so as to be sufficiently smaller than the value of λmin2 determined from size information 5, such that it satisfies the foregoing relationship of Equation (10) and allows the LSI to be divided into cells with lcell2 having the value of an integer.

$$lcell2 \leq \lambda min2/n \tag{10}$$

Similar to the first embodiment, in this equation, the value of n must be determined such that lcell2 is electrically sufficiently smaller than λ min2. In general, it is preferable that n takes a value such as 10-20, which renders lcell2 sufficiently smaller than λmin2 and does not cause a large increase in calculation time. However, similar to the first embodiment, the value of n is not necessarily limited to the above value, if necessary, from a tradeoff of the accuracy of analysis, a calculation time and the like.

Processing performed by model creation unit 220 comprises two steps 221, 222.

Figure 10:
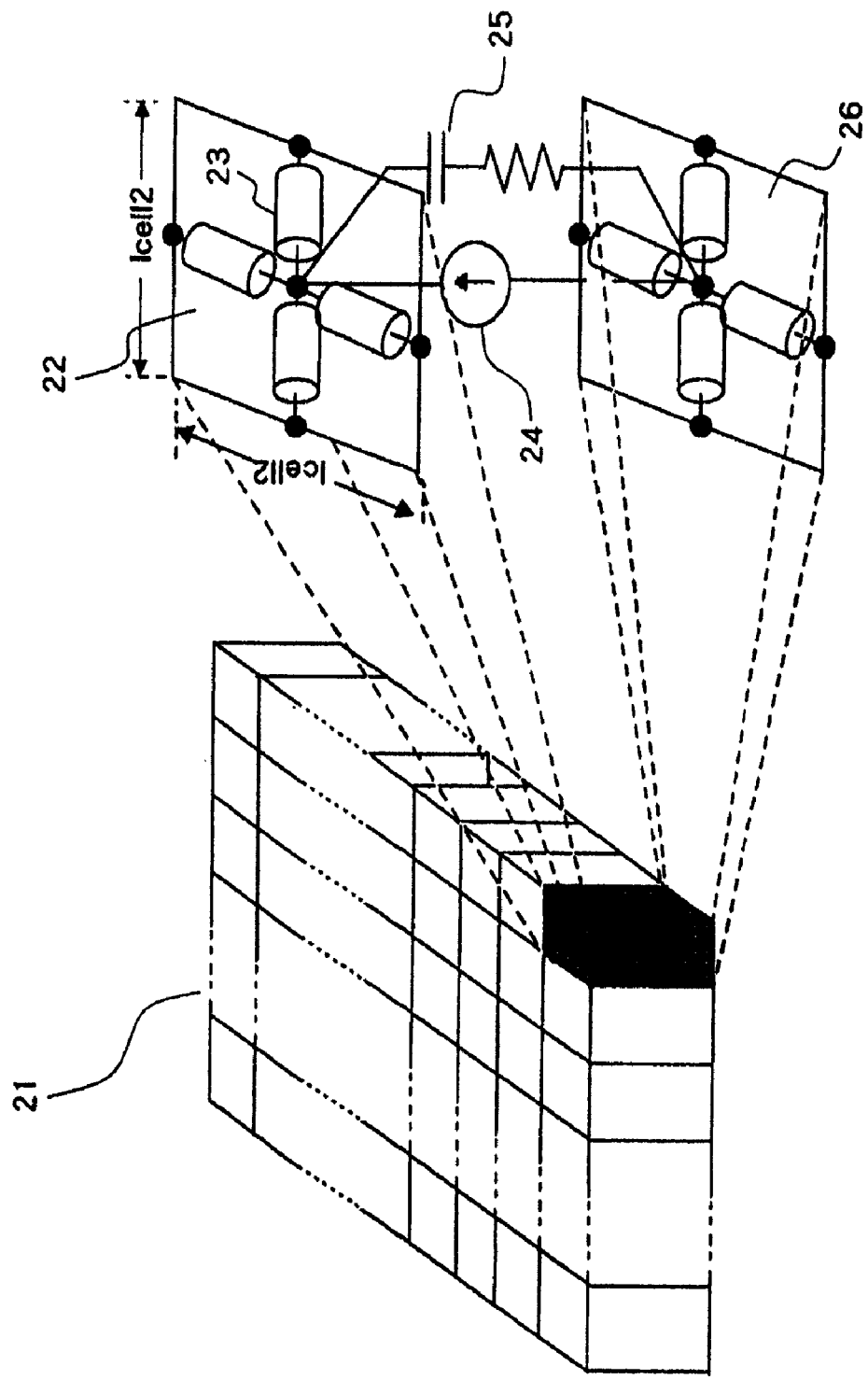
[FIG. 10]

At step 221, a model of a power supply circuit network of a cell is created in accordance with the size of the cell that is determined from power supply circuit network wiring structure information 2 and the value of lcell2 derived by divided cell size decision unit 210. Since there are two power supply circuit network layers, the models of power supply circuit networks exist in two layers, each layer existing as a model of a power supply circuit network in a reticular pattern, the structure of which comprises a terminal connected to an active section and to an internal capacitance section at the center of the cell, and comprises terminals for coupling with adjacent cells on the outer sides. In FIG. 10, model 22 of the power supply circuit network is of a cross-like shape, and comprises the terminals for coupling with other cells positioned at the center of the sides, but another shape can also be selected, as is the case with the first embodiment. Further, although a distributed model is used for model 23 of a wire, a lumped model which is described with an inductance, a resistance, and a capacitance can also be selected.

At step 222, model 24 of an internal active section and model 25 of an internal capacitance section are inserted into each cell at an appropriate proportion in accordance with the size of the cell and layout information on elements within the LSI that are determined from element arrangement information 6, semiconductor integrated circuit entire power pin model 7, and the value of lcell2 derived by divided cell size decision unit 200, and models 24 and 25 are connected between the models of the power supply circuit networks.

Similar to the first embodiment, the proportions of each size of model 24 of the internal active section and of model 25 of the internal capacitance section in FIG. 10 to the size of the model of the overall LSI created by divided cell size decision unit 210 are values that are conceivable from the size of the cell, layout information and the like. In the case of FIG. 8 as well, similar to the first embodiment, the model of a current source is also used for the active section, and a lumped model is used for the internal capacitance section. A model of each cell can thus be automatically created by multiplying the size of the model of the overall LSI by the proportion. Also, similar to the first embodiment, even if another model such as a transistor description is used, a model of each cell can be created from the model of the overall LSI, and it is also possible to make the proportions of the internal active section and of the internal capacitance section to the overall LSI different in accordance with element arrangement information 6.

Processing performed by model coupling unit 230 comprises step 231.

At step 231, model coupling unit 230 couples the model of each cell created by model creation unit 220 to respective external cells through connection terminals, to obtain power pin model 20 for the overall LSI having two power supply circuit network layers. Similar to the first embodiment, the coupling terminals on the sides of each outermost cell may be single or plural terminals for connection with the outside of the LSI, or otherwise no connection is carried out.

In this way, power pin model 20 for the overall LSI having two power supply circuit network layers can be created from power supply circuit network wiring structure information 2, transistor structure information 3, analysis frequency information 4, size information 5, element arrangement information 6, and semiconductor integrated circuit entire power pin model 7. Similar to the first embodiment, even if model 24 of the active section and model 25 of the internal capacitance section exist in a concentrated manner, their distances present electrically sufficiently smaller values than the wavelength corresponding to the upper limit of the analysis frequency calculated using the value of the wavelength shortening when a capacitance is connected with a wire. Therefore, power pin model 20 when the model of the active section and model of the internal capacitance section exist in a concentrated manner can be deemed to have an analysis accuracy equivalent to that when the active section and the internal capacitance section are distributed within the LSI. Also, since the LSI is divided into cells of an appropriate size, the active section and the internal capacitance are allocated to each cell at an appropriate proportion in consideration of the size and layout information, and they are coupled through the model of a power supply circuit network, the resulting model is a model that takes positional information into consideration and that can sufficiently cope with increasingly higher analysis frequencies.

Processing performed at each of the forgoing steps will now be described using specific values, similarly to the first embodiment.

First, input data 2-7 are prepared. At this time, assume that analysis frequency information 4 describes the upper limit analysis frequency of 1 GHz, and wavelength λ 1 GHz0 corresponding thereto of 300 [mm] in vacuum; size information 5 describes LSI chip size of 6 [mm]×6 [mm]; and semiconductor integrated circuit entire power pin model 7 describes the active section using a model of a current source and the internal capacitance section using a single lumped capacitive element, the value of the amplitude of the current source being 1 [A], and an internal capacitance being 3500 [pF]. Also assume that data required to create models have been prepared for other input data 2, 3 and 6.

At step 211, total value Cline2 of wiring capacitances between the power supply circuit network wires on the two power supply circuit network layers and ground is calculated from power supply circuit network wiring structure information 2. Assume herein that Cline2=100 [pF] has been calculated.

At step 112, total value Cin2 of internal capacitances between the two power supply circuit network layers is calculated from transistor structure information 3. Assume herein that Cin2=5000 [pF] has been calculated. This value is also equal to the value of the internal capacitance section of semiconductor integrated circuit entire power pin model 7, because the internal capacitance section is described using a capacitive element. Since the internal capacitance section may also be described using transistors and the like, the values must be calculated at step 212.

At step 213, value η n of a wavelength shortening of the power supply circuit network wire is calculated from power supply circuit network wiring structure information 2. Assuming herein that dielectric constant ∈r of the dielectric material in the wire which constitutes the power supply circuit network wire, is four, then η n is calculated by:

$$\eta_n = 1/\sqrt{4} = 0.5 \qquad \text{[Equation 10]}$$

from Equation (1).

At step 214, the value η d2 of the wavelength shortening of the power supply circuit network wire when internal capacitance exists, is calculated. From Equation (7):

[Equation 11]

$$\eta_{d2} = \frac{0.5}{\sqrt{(100 + 5000)/100}} \approx 0.0700$$

is derived.

At step 215, value λmin2 of the apparent wavelength at upper limit analysis frequency Fmax is calculated from analysis frequency information 4. Here, since wavelength λ 1 GHz0 is 300 [mm] at 1 GHz in vacuum, λmin2=0.0700×300≈21.0 [mm]

is derived from Equation (8).

At step 216, length lcell1 of one side of the divided cell is calculated from the LSI layout information. Since the division size must be determined such that the distance between power pin models connected with the center of each divided cell, i.e., the length of one side of each divided cell, must be a length sufficiently smaller than apparent wavelength λmin2, lcell2≦21.0/10=2.10 [mm]

is obtained on the assumption that n=10 is selected in Equation (10) as a value which sufficiently satisfies the condition in Equation (10). Here, the LSI has a chip size of 6 [mm]×6 [mm], and if the value is selected as lcell2=2 [mm] which is an integer that satisfies the foregoing equation and allows the LSI to be divided into cells with lcell1 having the value of an integer, then an electrically appropriate model can be created without performing more finer divisions than is necessary. In this case, since the cell has the size of 2 [mm]×2 [mm], the LSI is made up of 9 divided cells.

At step 221, a model of a power supply circuit network corresponding to two power supply circuit network wires in each cell is created from power supply circuit network wiring structure information 2 and from the value of lcell2. Here, similar to the example shown in FIG. 10, a model of a wire comprises models described using distributed constants, created with the value of ∈r=4, and arranged in a cross-like manner.

At step 222, a power pin model of each cell is created from element arrangement information 6, semiconductor integrated circuit entire power pin model 7, and the value of Icell1, and is connected to the model of the power supply circuit network which corresponds to the two power supply circuit network wires and is created at step 221. Assuming from the layout information that the active section and the internal capacitance of the LSI are distributed on the LSI at an equal proportion, the proportions of the active section and the internal capacitance in each cell to the entire LSI are 1/9. Accordingly, the value of the amplitude of the current source and the capacitance value in each cell are calculated to be 1/9≈0.111 [A]; 5000/9≈555.6 [pF], respectively.

Finally, at step 231, the power pin models of the respective cells created by model creation unit 220 are coupled to create power pin model 27 for the LSI. Created power pin model 27 is shown in FIG. 11(a).

Figure 11:
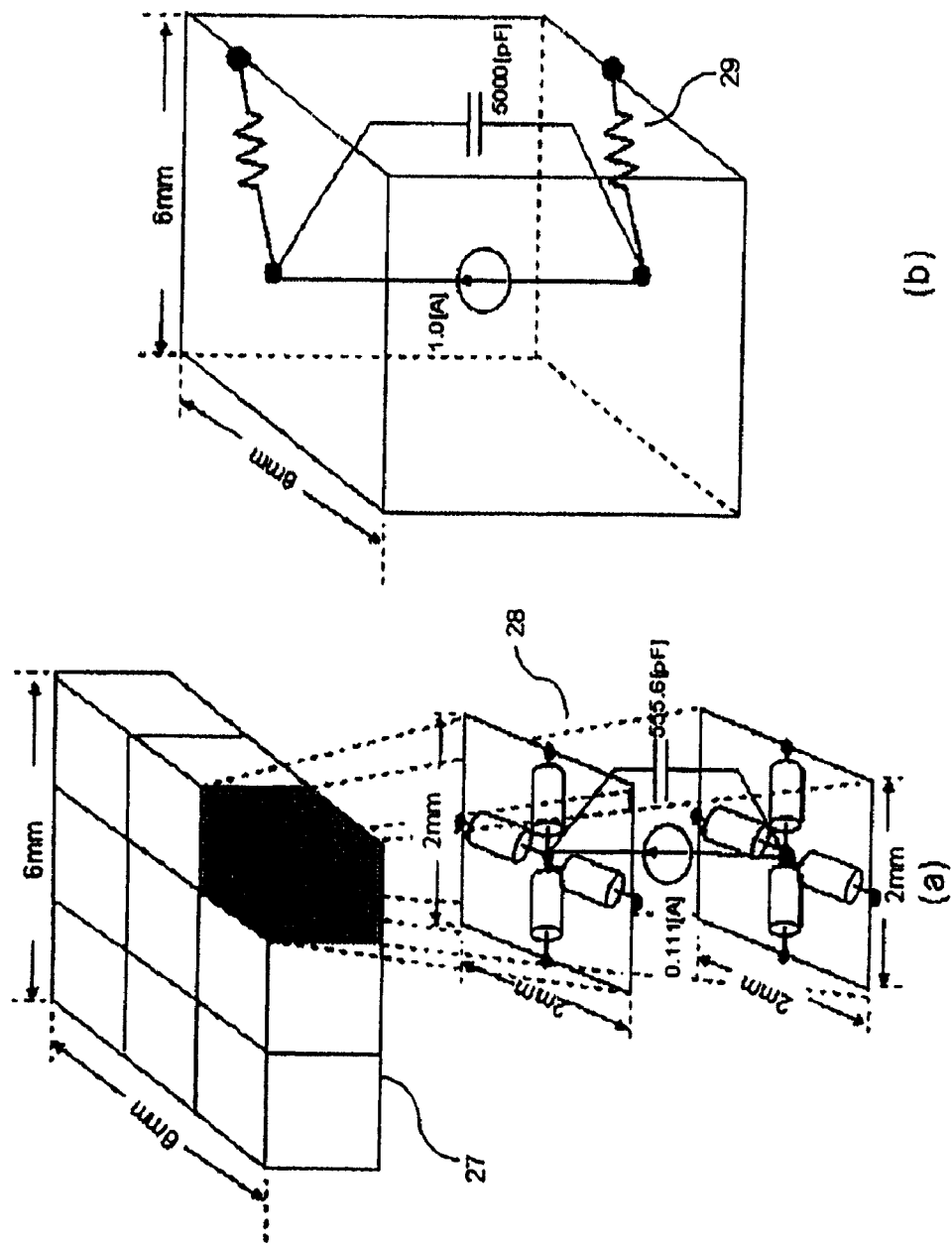
[FIG. 11]

A conventional power pin model for a similar LSI is shown in FIG. 11(b). As is the case with FIG. 7, the comparison between created power model 27 shown in FIG. 11(a) and the conventional power model shows that the former which comprises power pin models distributed at a distance electrically sufficiently smaller than the wavelength of the analysis frequency (~1 GHz), and connected by the power supply circuit networks exhibits a higher analysis accuracy than the power pin model (FIG. 11(b)) which is not so configured.

Third Embodiment

In this embodiment, a description will be made of a method of creating a power pin model of an LSI in a case where there are a plurality of active sections and internal capacitance sections for the power pin model of the LSI in each cell.

Figure 12:
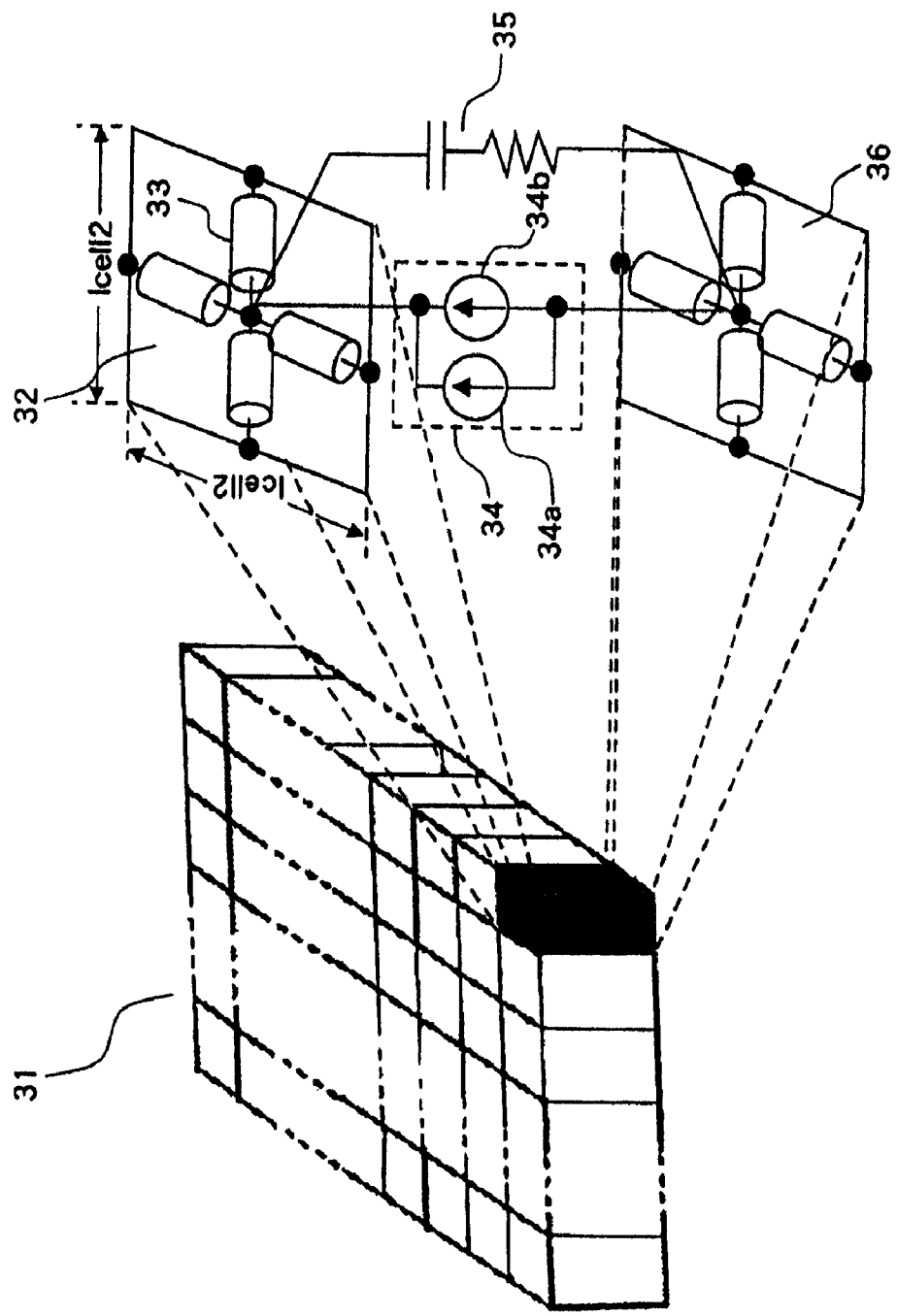
[FIG. 12]

FIG. 12 shows, by way of example, a power pin model for an LSI having two power supply circuit network layers in the present embodiment, the power pin model having a power pin model in each cell which includes two types of active sections. Since there are two types of active sections which perform different operations, such as different operation frequencies of the LSI, two types of active sections 34a, 34b are created. Further, since there are two types of active sections in the model of the overall LSI in semiconductor integrated circuit entire power pin model 7 of input data in FIG. 9, each active section is distributed to each cell at an appropriate proportion based on the size of each cell determined by divided cell size decision unit 210 and on element arrangement information 6 at step 212. Therefore, depending on element arrangement information 6, the proportion of the respective active sections (34a and 34b in FIG. 12) may be different in each cell. Of course, respective active sections 34a and 34b of active section 34 and internal capacitance section 35 may have different proportions. Moreover, although each of active sections 34a and 34b is described using a current source model in FIG. 12, a combination of different types of power pin model is also possible; for example, one power pin model is described using a transistor model.

Figure 13:
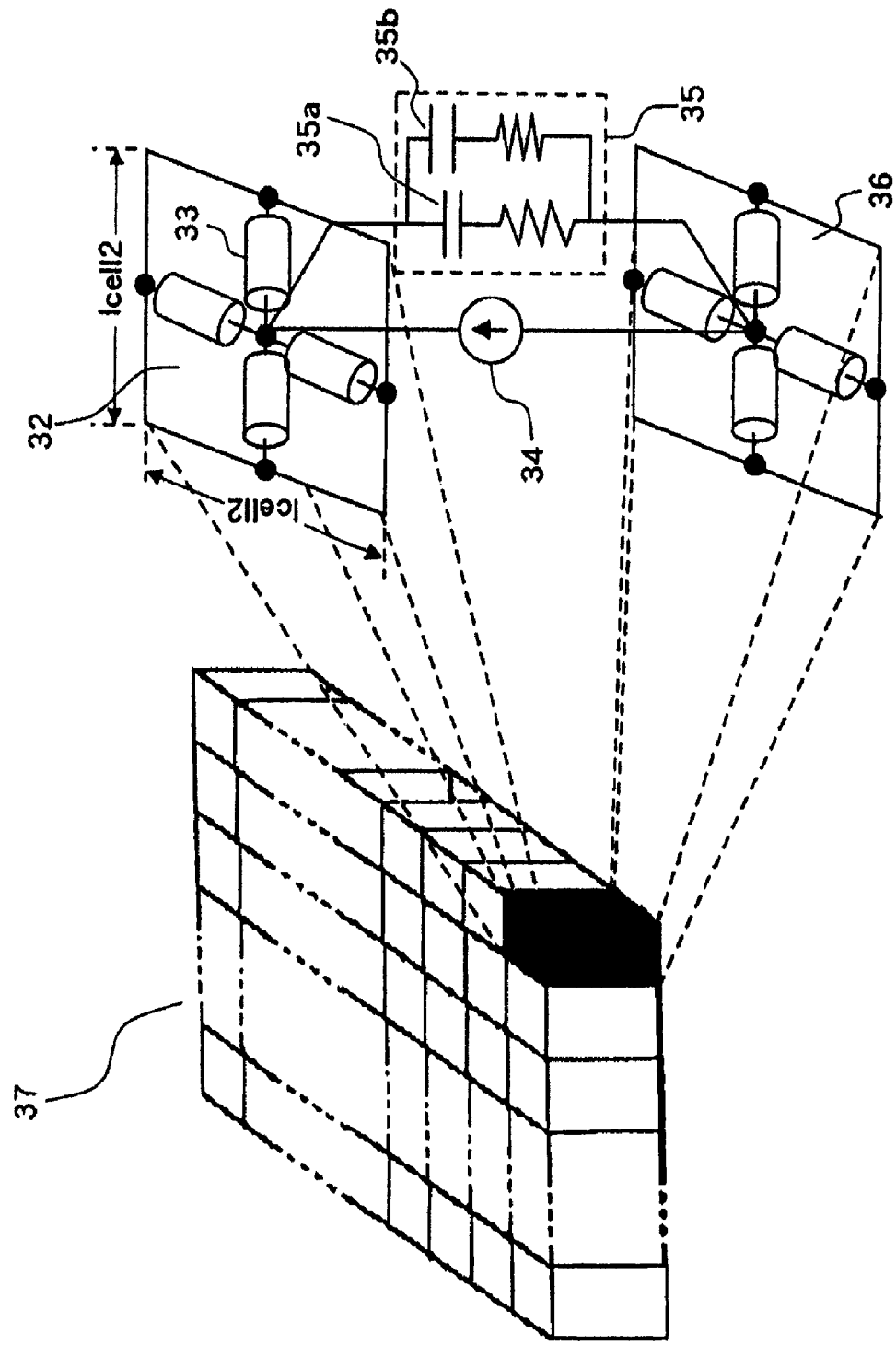
[FIG. 13]

FIG. 13 shows, by way of example, a power pin model 37 for an LSI having two power supply circuit network layers in the second embodiment, power pin model 37 having a power pin model in each cell which includes two types of internal capacitances. Since two different types of capacitances exist within the LSI, such as the capacitance of an existing inoperative transistor, a capacitance cell inserted into the LSI for increasing a decoupling effect, and the like, two types of internal capacitance sections 35a, 35b, as well, are created as internal capacitance section 35. These capacitances exhibit different characteristics; the proportion of a capacitance to a resistance differs from model to model when describing a model which has a capacitance and a resistance connected in series, as shown in FIG. 13.

Since two types of internal capacitance sections exist in semiconductor integrated circuit entire power pin model 7 of input data shown in FIG. 9, the two types of internal capacitance sections are distributed to each cell at an appropriate proportion based on the size of each cell determined by divided cell size decision unit 210 and on element arrangement information 6. Therefore, depending on the layout information, the proportion of the respective internal capacitance sections (35a and 35b in FIG. 13) in each cell may differ. Of course, active section 34 and respective internal capacitive sections 35a, 35b of internal capacitance section 35 may have different proportions. Moreover, although each of internal capacitance sections 35a, 35b is described using a model having a capacitance and a resistance connected in series in FIG. 13, another combination is also possible; for example, one model is described using a model having a transistor.

In this example, both FIGS. 12 and 13 show a power pin model of each cell when there are two power supply circuit network layers in the second embodiment. A power pin model of each cell when there is only one power supply circuit network layer in the first embodiment is similar to the power pin model of each cell when there are two power supply circuit network layers in the second embodiment.

Figure 14:
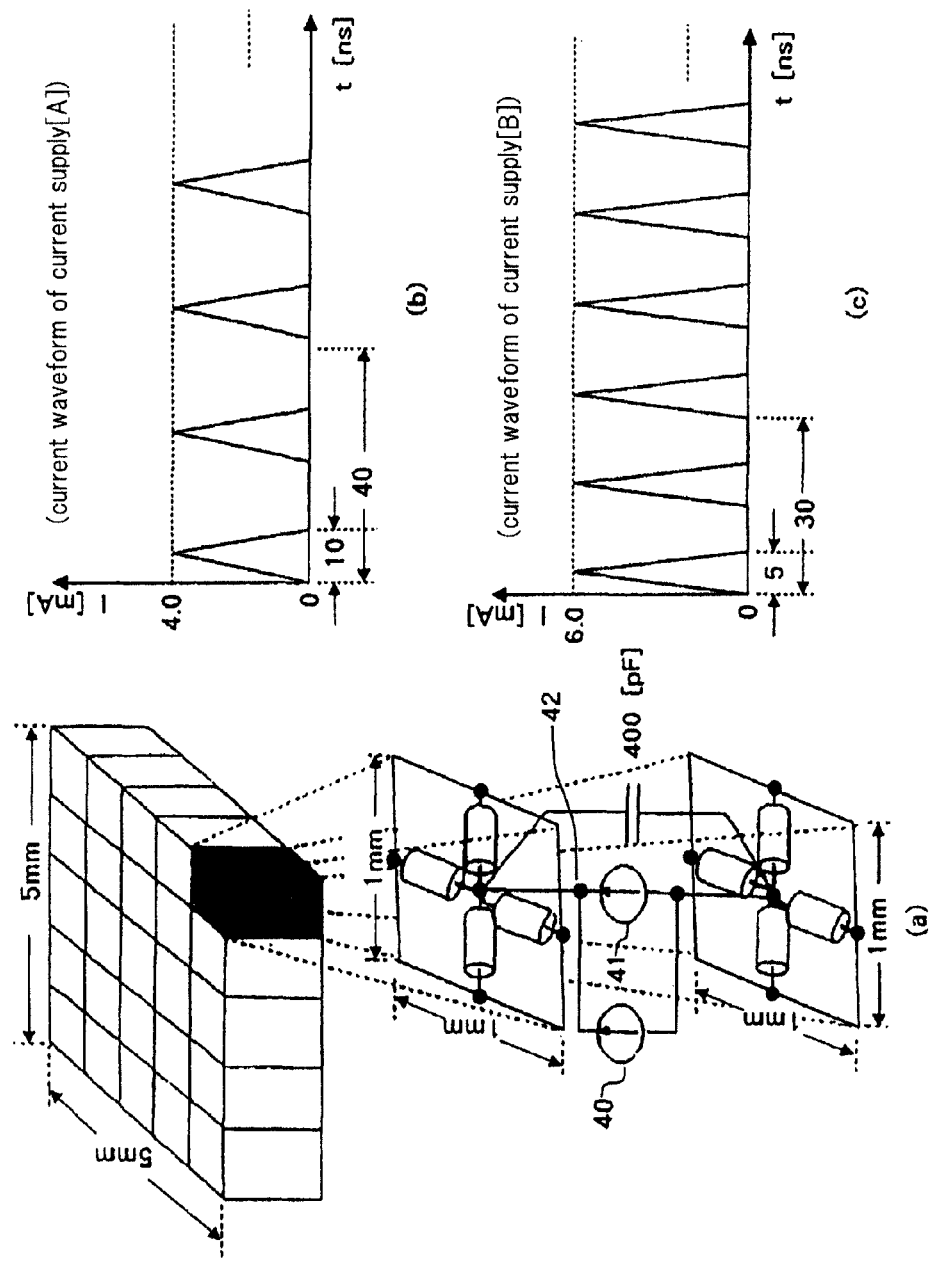
[FIG. 14]
Figure 15:
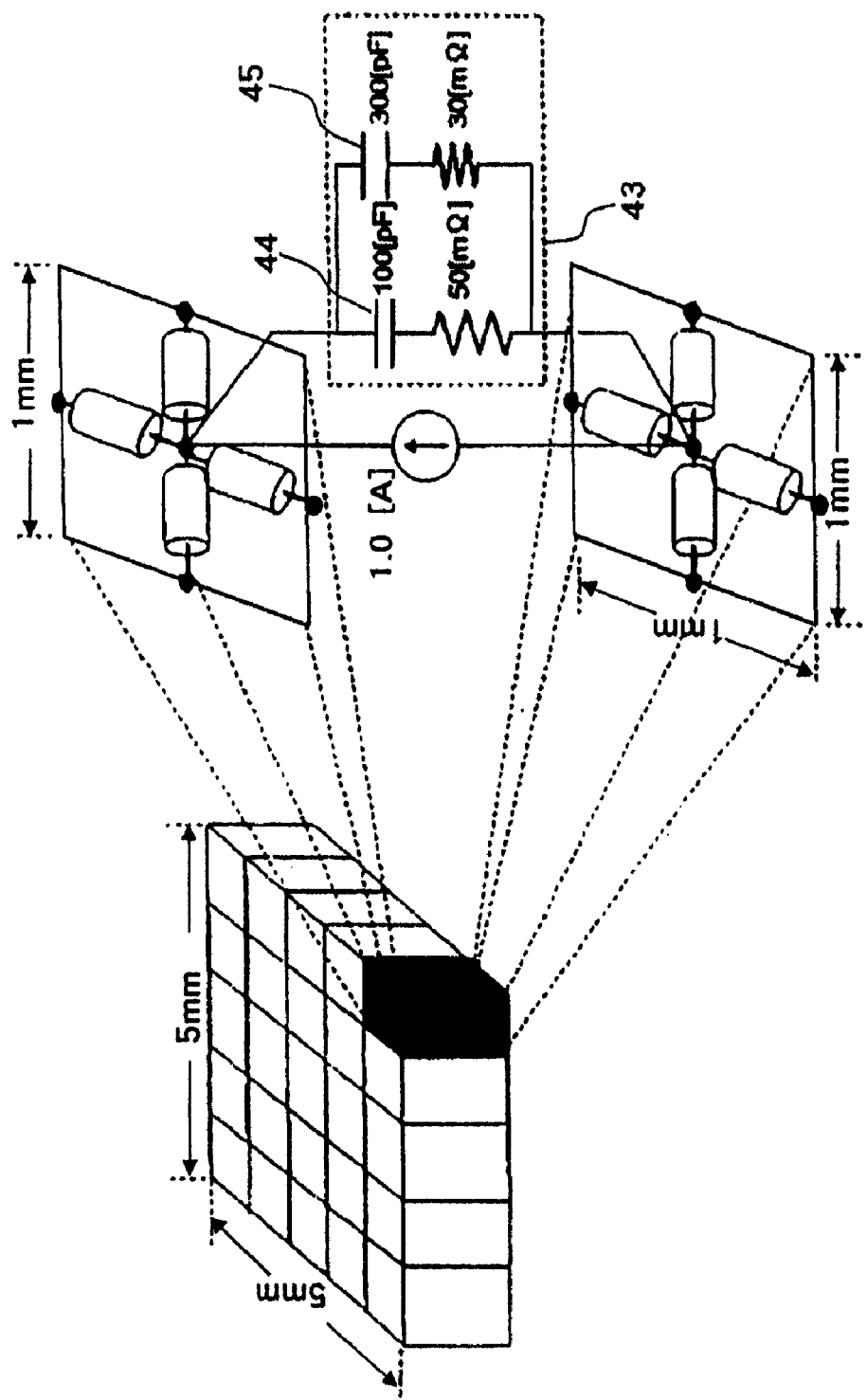
[FIG. 15]

Specific examples of the embodiment are shown in FIGS. 14 and 15.

FIG. 14(a) shows a model having two power supply circuit network layers of an LSI with the dimension of 5 mm×5 mm and being divided into 5×5 cells, the model having only one type of an internal capacitance section: a capacitive element of 400 [pF] and two types of an active section for each cell. Both two types of the active section are represented by a current source which changes over time. Current source [A] indicated at 40 outputs a triangular wave that has a peak value of 40 [mA] and a base of 10 [ns], as shown in FIG. 14(b), to terminal 42 twice at intervals of 40 [ns]. Current source [B] indicated at 41 outputs a triangular wave that has a peak value of 60 [mA] and a base of 5 [ns], as shown in FIG. 14(c), to terminal 42 twice at intervals of 30 [ns]. Accordingly, a composite output of the outputs from current sources [A] and [B] is output to terminal 42.

FIG. 15 also shows a model having two power supply circuit network layers of an LSI with the dimension of 5 mm×5 mm and being divided into 5×5 cells, the model having only one type of an active section: a current source with the amplitude of 1 [A], and two types of an internal capacitance section for each cell. Internal capacitance section 43 is comprised of internal capacitance section [A] 44 having a capacitive element of 100 [pF] and a resistive element of 50 [mΩ] both being connected in series with one another, and internal capacitance section [B] 45 having a capacitive element of 300 [pF] and a resistive element 30 [mΩ] both being connected in series one another. Internal capacitance sections 44, 45 have different frequency characteristics because the proportion of the resistance value of a resistive element connected in series with internal capacitance section 44 and the capacitive value of internal capacitance section 44 differs from the proportion of the resistance value of a resistive element connected in series with internal capacitance sections 45 and the capacitive value of internal capacitance section 45.

Fourth Embodiment

In this embodiment, a description will be made of a method of creating a model in a power pin model of an LSI which has a plurality sets of power supply systems, wherein a power supply circuit network layer is divided into cells having the same size, each cell having a plurality of power supply systems, and each cell having an active section and an internal capacitance section for each power supply system at an appropriate proportion based on the cell size and layout information.

Figure 16:
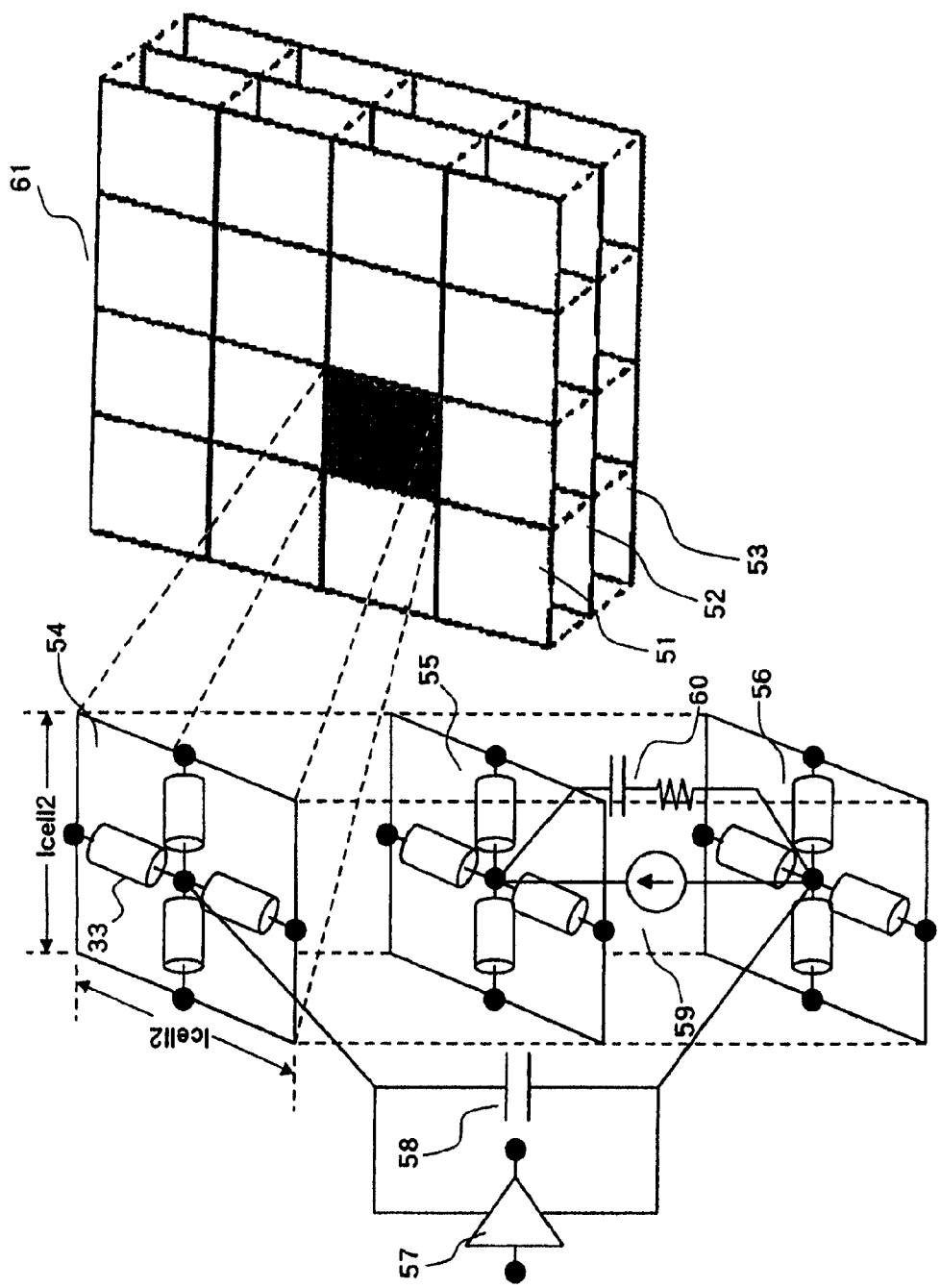
[FIG. 16]

FIG. 16 shows a model in each cell of a power pin model of an LSI which includes three power supply circuit network layers in its chip, as an example in this embodiment. The difference in potential between first power supply circuit network layer 51 and third power supply circuit network layer 53, and the difference in potential between second power supply circuit network layer 52 and third power supply circuit network layer 53 are different one another. Thus, this LSI can be considered to have two power supply systems. In this case, a modeling processing is performed between the first and third power supply circuit network layers and between the second and third power supply circuit network layers in accordance with the example of the second embodiment. Different from an LSI having one power supply system is that divided cell size decision unit 210 performs the processing at steps 211-216 for the respective power supply systems, determines the value of lcell2 which satisfies Equation (10) for the respective power supply systems, and divides the LSI into cells. At this time, the value of n is rendered common in the processing for the respective systems. Subsequently, at step 211, models 54, 55, and 56 of power supply circuit network layers are created for respective power supply circuit network layers 51, 52, 53 in each cell, and models of an active section and an internal capacitance section in the respective power supply systems are connected between the models of the power supply circuit network layers of the respective power supply systems at an appropriate proportion in accordance with the cell size determined by divided cell size decision unit 210 and element arrangement information 6 and from semiconductor integrated circuit entire power pin model 7. The models of each cell are then connected through the connection terminals of the model of each power supply circuit network layer in model coupling unit 220, and a power pin model of the LSI having a plurality of power supply systems is created. The processing for the external terminals is similar to that shown in the second embodiment.

The power pin model of each cell shown in FIG. 16 has models 54, 55, and 56 for a first, second, and third power supply circuit network each corresponding to first, second, and third power supply circuit network layers 51, 52, 53, and has an active section and an internal capacitance section in the respective power supply system. At this time, in some cases, there is a plurality of models of the active section and the internal capacitance section in each power supply, as shown in the third embodiment. Also, as shown in FIG. 16, active section 57 is a transistor description model, and internal capacitance section 58 is a capacitance alone model between first and third power supply circuit network layers 51, 53, while active section 59 is a current source model, and internal capacitance section 60 is a model of a description of a series connection of a capacitance and a resistance between second and third power supply circuit network layers 52, 53. Although the respective power supply systems differ in the description of a model, the description of the model can be changed as required, and a common description will not cause any problem.

In the above-described example, there are three power supply circuit network layers and two types of power supply systems. In some cases, despite two power supply circuit network layers, each layer has a power supply system between the power supply circuit network layer and ground. In this case, a power pin model can be similarly created by replacing the power supply circuit network layer used in the second embodiment with the power supply circuit network layer in the first embodiment using the aforementioned method.

Even when there are three or more power supply systems, a power pin model can be created by similar processing.

Figure 17:
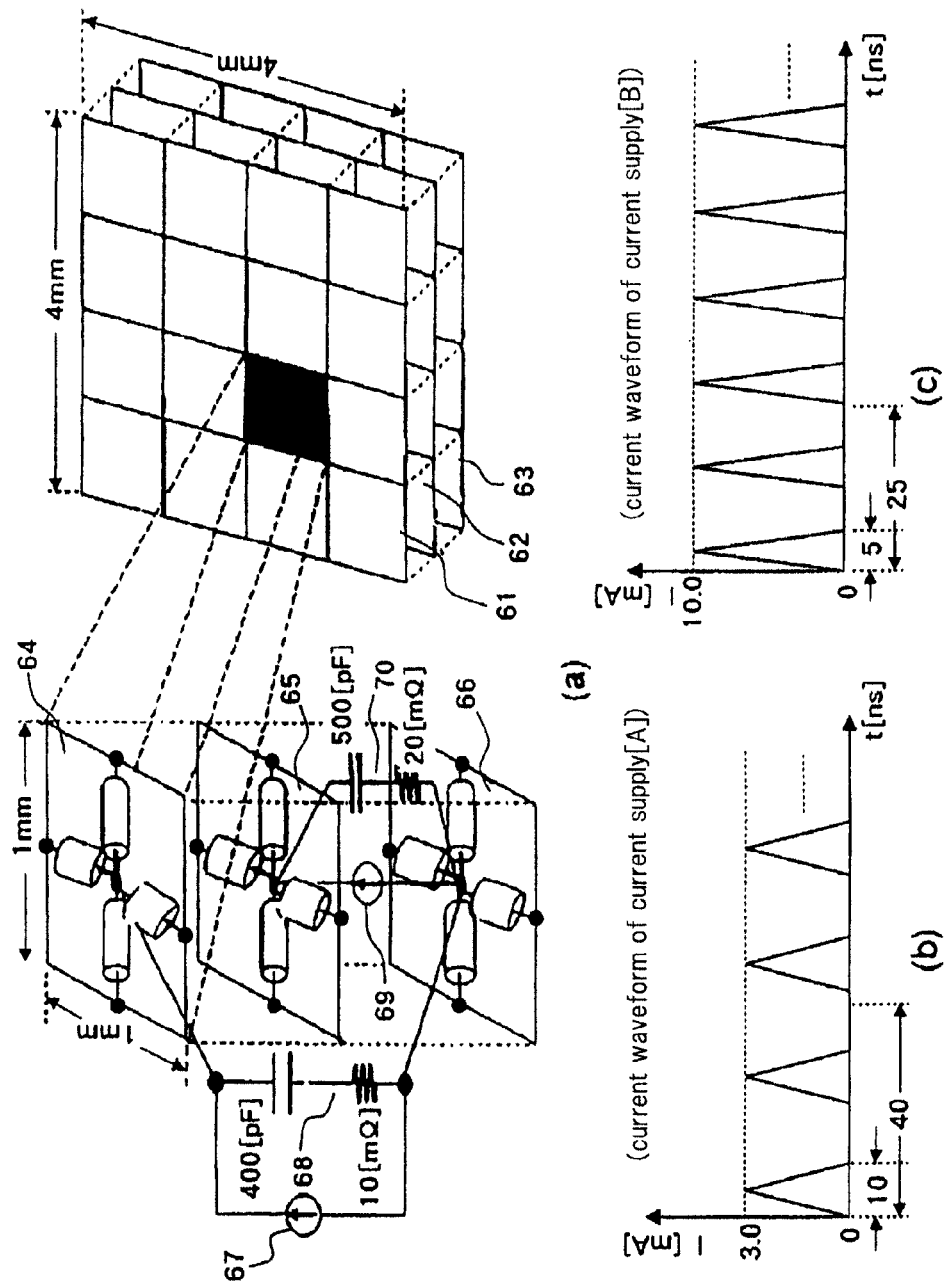
[FIG. 17]

A specific example of this embodiment is shown in FIG. 17.

FIG. 17($a$) shows a model of an LSI with the dimension of 4 [mm]×4 [mm], the LSI having three power supply circuit network layers 61, 62, 63 and divided into 4×4 cells with the dimension of 1 [mm]×1 [mm]. A power supply system exists between power supply circuit network layers 61 and 63 and between power supply circuit network layers 62 and 63. A model for each cell is constituted by power supply circuit network models 64, 65, 66 each corresponding to power supply circuit network layers 61, 62, 63; current source 67 [A] as an active section and internal capacitance section 68 [C] as an internal capacitance section that has a capacitive element of 100 [pF] and a resistive element of 10 [mΩ] connected in series with the capacitive element, current source 67 [A] and internal capacitance section 68 [C] both being disposed between power supply circuit network mode 64 and 66; and current source 69 [B] as an active section and internal capacitance section 70 [D] as an internal capacitance section that has a capacitive element of 500 [pF] and a resistive element of 20 [mΩ] connected in series with the capacitive element, current source 69 [B] and internal capacitance section 70 [D] both being disposed between power supply circuit network models 66 and 65. Active sections 67, 69 both are models represented by current sources which change over time. Current source 67 [A] outputs a triangular wave that has a peak value of 3.0 [mA] and a base of 10 [ns], as shown in FIG. 17($b$), twice at intervals of 40 [ns]. Current source 69 [B] outputs a triangular wave that has a peak value of 10.0 [mA] and a base of 5 [ns], as shown in FIG. 17($c$), twice at intervals of 25 [ns]. Thus, the combination of the operations of the two types of power supply systems including the operations of current sources 67 and 69 is the operation of the model of each cell.

Fifth Embodiment

In this embodiment, a description will be made of a computer program for creating a power pin model of an LSI which is divided into cells of an appropriate size, based on input information including power supply circuit network wiring structure information, transistor structure information, analysis frequency information, size information, element arrangement information, and semiconductor integrated circuit entire power pin model, and of a power pin model creating apparatus which uses the computer program.

Figure 18:
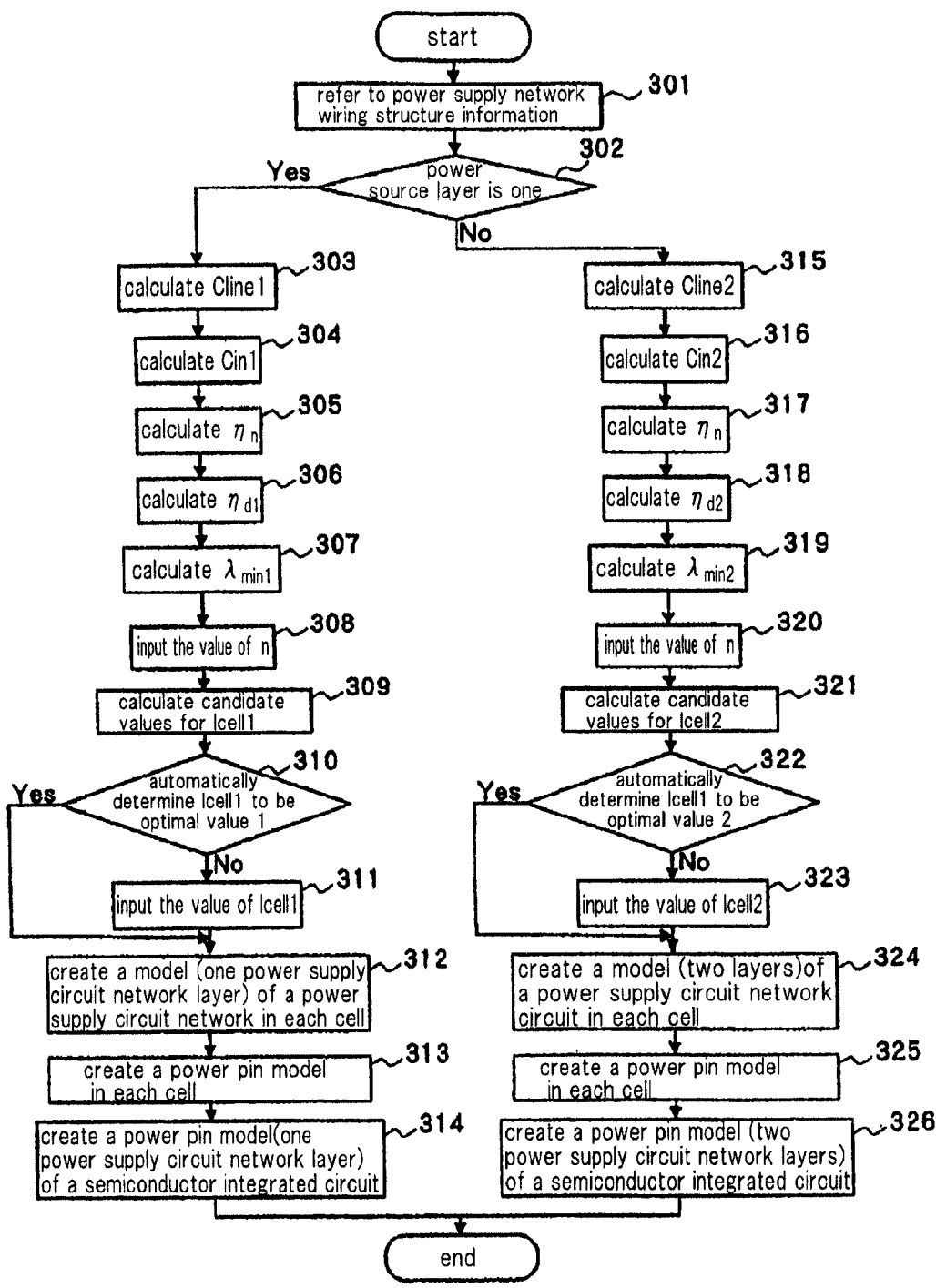
[FIG. 18]
Figure 19:
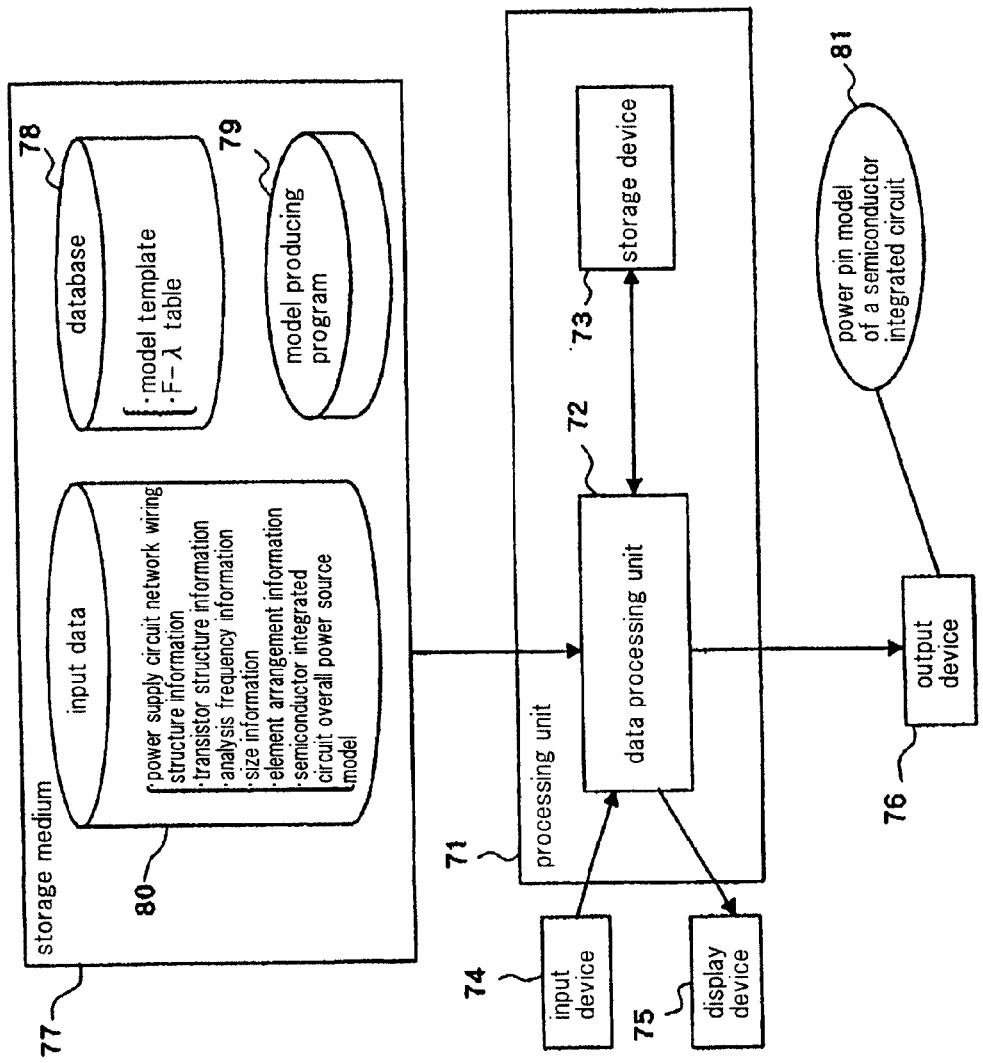
[FIG. 19]

FIG. 18 is a flow chart illustrating an example of a computer program for creating a power pin model of an LSI in accordance with the method described in the first and second embodiments. FIG. 19 is a diagram showing the configuration of an LSI power pin model creating apparatus which uses the compute program illustrated in FIG. 18.

The power pin model creation supporting apparatus shown in FIG. 19 comprises processing unit 71 including data processing unit 72 which operates under the control of a computer program and storage device 73 for storing information;

input device 74; display device 75; output device 76; and recording medium 77. Input device 74 is a device such as a keyboard and a mouse, a speech input device and the like, by means of which a user can arbitrarily enter data. Display device 75 is a device, by means of which the user can confirm the result of entered data and the progress of processing. Output device 76 is a device such as a printing device, a data storage device and the like, which enables the user to obtain a description of a power pin model of an LSI which is the result of output produced by processing. Recording medium 77 records therein database 78 which stores a template that contains a circuit structure and a describing method for a power pin model in each cell, shown in FIGS. 6, 10, 12, 13, and 16, and an F–λ table that is information indicative of the relationship between the frequency and wavelength in vacuum; program (hereinafter also referred to as "model production program") 79 for implementing the model creating method described in FIG. 18; and input data 80 for creating a power pin model. This recording medium 80 may be a magnetic disk, a semiconductor memory, CD-ROM, or other recording medium. Model production program 79 is read from recording medium 77 and written into processing unit 71 for purposes of controlling the operation of processing unit 71.

First, input data 80 is input from input device 74 to processing unit 71, and the data is stored in storage device 73. This input data 80 refers to input data 1 in the flow charts of FIGS. 4 and 9, and contains data in power supply circuit network wiring structure information 2 of power supply circuit network wiring structure information LSI, such as the number of power supply circuit network layers, the length, width, and thickness of power supply circuit network wires, the type of a dielectric material, and the like; transistor structure information 3 that includes a gate width, a gate length, the surface area of a diffusion layer, and the like, of transistors which form an internal capacitance section; analysis frequency information 4 which is information on an upper limit frequency when a model is used; size information 5 which is the chip size of the LSI; element arrangement information 6 which is layout information on an active section and an internal capacitance of the LSI; and semiconductor integrated circuit entire power pin model 7 which is a power pin model in the conventional description, constituted by active sections and internal capacitance sections of the overall LSI. This data is usually recorded on recording medium 77 together with database 78 and model production program 79, and is read therefrom by input device 74. However, part or all of input data 80 may be newly provided by input device 74, instead of being read from recording medium 77 (analysis frequency information 4 is newly provided by input device 74, while the remaining data is read from recording medium 77, and the like).

Next, model production program 79 is read from recording medium 77 and processing unit 71 is controlled by model production program 79, so that the processing of the model production program of FIG. 18 is initiated. This processing may be automatically initiated at the time input data 80 has been completely entered.

Next, stored power supply circuit network wiring structure information 2 is read from storage device 73, and it is determined from the information whether or not a power pin model to be created has one power supply circuit network layer (steps 301, 302).

If the power supply circuit network layer is one, the following processing is performed.

First, stored power supply circuit network wiring structure information 2 is again read from storage device 73, and total value Cline1 of wire capacitances is calculated and then stored in storage device 73 (step 303).

Next, stored transistor structure information 3 is read from storage device 73, and total value Cin1 of internal capacitances is calculated and then stored in storage device 73 (step 304).

Next, stored power supply circuit network wiring structure information 2 is again read from storage device 73, and value η n of a wavelength shortening in vacuum is calculated and then stored in storage device 73 (step 305).

Next, the stored values of Cline1, Cin1, and η n are read from storage device 73, and value η d1 of a wavelength shortening of the power supply circuit network wires when internal capacitances are present, is calculated and then stored in storage device 73 (step 306).

Next, stored analysis frequency information 4 and the value of η d1 are read from storage device 73, values in the F–λ table stored in database 78 are read from recording medium 77, and the value of wavelength λmin1 corresponding to the upper limit analysis frequency is calculated and then stored in storage device 73 (step 307).

Next, the value of n in Equation (5) is entered through input device 74 and stored in storage device 73. This value of n may be stored in input data 80 or database 78, in which case the value is read from storage device 77 and stored in storage device 73 (step 308).

Next, the stored value of λmin1, value of n, and size information 5 are read from storage device 73, and from Equation (5), candidate values for length lcell1 of one side of divided cells are determined and then stored in storage device 73. The determined values of Lcell1 include a maximum value (hereinafter also referred to as "optimal value 1") which satisfies Equation (5) and allows the LSI chip to be exactly divided into the cells having length lcell1 that is an integer, and an infinite number of values which are obtained by dividing optimal value 1 by integers. However, since the storage capacity is limited, it is intended that an arbitrary number of values (ten values including optimal value 1 and ½, ⅓, . . . , ¹⁄₁₀ of optimal value1, for example) are stored in storage device 73. Alternatively, a condition equation may be stored as it is instead of the candidate values for lcell1 (step 309).

Next, the stored candidate values for lcell1 are read from storage device 73, and the user determines whether or not lcell1 is automatically determined to be optimal value 1, and enters the result using input device 74 (step 310). When lcell1 is automatically determined to be optimal value 1, optimal value 1 is selected for the value of lcell1, and is stored in storage device 73. On the other hand, when lcell1 is not automatically determined to be optimal value 1, the user selects a value from the candidate values for lcell1 displayed on display device 75, and enters the value of lcell1 through input device 74, which is then stored in storage device 73 (step 311).

Next, stored power supply circuit network wiring structure information 2, and the value of lcell1 are read from storage device 73, and a template for a model of a power supply circuit network is read from database 78 to create a model of a power supply circuit network in each cell, and the configuration of the model of the power supply circuit network for each cell is stored in storage device 73 (step 312).

Next, stored element arrangement information 6, semiconductor integrated circuit entire power pin model 7, value of lcell1, and the configuration of the model of the power supply circuit network for each cell are read from storage device 73, and a template for a power pin model is further read from database 78 to create a power pin model in each cell, and the configuration of the power pin model of each cell is stored in storage device 73 (step 313).

Next, the stored configuration of the power pin model of each cell is read from storage device 73, and the cells are coupled to one another to create power pin model 81 (power pin model 10 in FIG. 3) for the LSI (step 314). This result is output from output device 76.

On the other hand, if is determined at step 302 in FIG. 18 that there are two or more power supply circuit network layers, then the following processing is performed.

First, stored power supply circuit network wiring structure information 2 is again read from storage device 73, and total value Cline2 of wiring capacitances is calculated and stored in storage device 73 (step 315).

Next, stored transistor structure information 3 is read from storage device 73 and total value Cin2 of internal capacitances is calculated and then stored in storage device 73 (step 316).

Next, stored power supply circuit network wiring structure information 2 is again read from storage device 73 and value η n of a wavelength shortening in vacuum is calculated and then stored in storage device 73 (step 317).

Next, the stored values of Cline2, Cin2, and η n are read from storage device 73 and value η d2 of a wavelength shortening of the power supply circuit network wires when internal capacitances are present, is calculated and then stored in storage device 73 (step 318).

Next, stored analysis frequency information 4 and the value of η d2 are read from storage device 73, values in the F–λ table stored in database 78 are read from recording medium 77, and wavelength λmin2 corresponding to the upper limit analysis frequency is calculated and then stored in storage device 73 (step 319).

Next, the value of n in Equation (10) is entered through input device 74 and stored in storage device 73. As is the case with step 308, this value of n may have been stored in input data 80 or database 78, and the value may be read from storage device 77 and stored in storage device 73 (step 320).

Next, the stored value of λmin2, the value of n, and size information 5 are read from storage device 73, and from Equation (10), candidate values for length lcell2 of one side of divided cells are determined and then stored in storage device 73. The determined values of Lcell2 include a maximum value (hereinafter also referred to as "optimal value 2") which satisfies Equation (10) and allows the LSI chip to be exactly divided into the cells having length lcell2 that is an integer, and an infinite number of values which are obtained by dividing optimal value 2 by integers. However, since the storage capacity is limited, it is intended that an arbitrary number of values (ten values including optimal value 1 and ½, ⅓, . . . , ¹⁄₁₀ of optimal value1, for example) are stored in storage device 73. Alternatively, a condition equation may be stored as it is instead of the candidate values for lcell1 (step 321).

Next, the stored candidate values for lcell2 are read from storage device 73, and the user determines whether or not lcell2 is automatically determined to be optimal value 2, and enters the result using input device 74 (step 322). When lcell2 is automatically determined to be optimal value 2, optimal value 2 is selected for the value of lcell2, and is stored in storage device 73. On the other hand, when lcell2 is not automatically determined to be optimal value 2, the user selects a value from the candidate values for lcell2 displayed on display device 75, and enters the value of lcell2 through input device 74, which is then stored in storage device 73 (step 323).

Next, stored power supply circuit network wiring structure information 2 and the value of lcell2 are read from storage device 73, a template for a model of a power supply circuit network is read from database 78, a model of a power supply circuit network in each cell is created, and the configuration of the model of the power supply circuit network for each cell is stored in storage device 73 (step 324).

Next, stored element arrangement information 6, semiconductor integrated circuit entire power pin model 7, the value of lcell2, and the configuration of the model of the power supply circuit network for each cell are read from storage device 73, a template for a power pin model is read from database 78, a power pin model in each cell is created, and the configuration of the power pin model of each cell is stored in storage device 73 (step 325).

Next, the stored configuration of the power pin model of each cell is read from storage device 73, and the cells are coupled to one another to create power pin model 81 (power pin model 20 in FIG. 9) for the LSI (step 326). This result is output from output device 76.

As appreciated, processing at each step in FIG. 18 corresponds to the processing at each step in the block diagrams in the first embodiment of FIG. 4 and in the second embodiment of FIG. 9. Step 303 in FIG. 18 corresponds to step 111 in FIG. 4; step 304 to step 112; step 305 to step 113; step 306 to step 114; step 307 to step 115; steps 308-311 to step 116; step 312 to step 122; and step 314 to step 131, respectively. Also, step 315 in FIG. 18 corresponds to step 211 in FIG. 9; step 316 to step 212; step 317 to step 213; step 318 to step 214; step 319 to step 215; steps 320-323 to step 216; step 324 to step 221; step 325 to step 222; and step 326 to step 231, respectively.

In the model creating computer program of FIG. 18 and the power pin model creating apparatus shown in FIG. 19, the power pin model of an LSI having appropriate analysis accuracy can substantially automatically be created by the user preparing necessary data. Further, the combination of the power pin model creating apparatus with an automatic creation supporting system which employs a previously proposed approach of automatically creating semiconductor integrated circuit entire power pin model 7 allows input data prepared by the user to be further reduced, thus making it possible to create a power pin model of an LSI without requiring substantially any knowledge about creating the power pin model of the LSI.

Furthermore, in a case where there are a plurality of power supply systems shown in the fourth embodiment, as in FIG. 16, a power pin model of an LSI can be similarly created by executing the processing at steps 303-314 or steps 315-326 for the plurality of power supply systems in the program of FIG. 18.

Use of such a power pin model creating apparatus allows a power pin model of an LSI to be automatically created by entering the entire circuit connection information, layout information and analysis conditions of the LSI. This system requires an approach for creating an active section and an internal capacitance section in the overall LSI. However, by incorporating any of several types of approaches that have been previously proposed as this approach, into the system, the system can be simply implemented.

Figure 7:
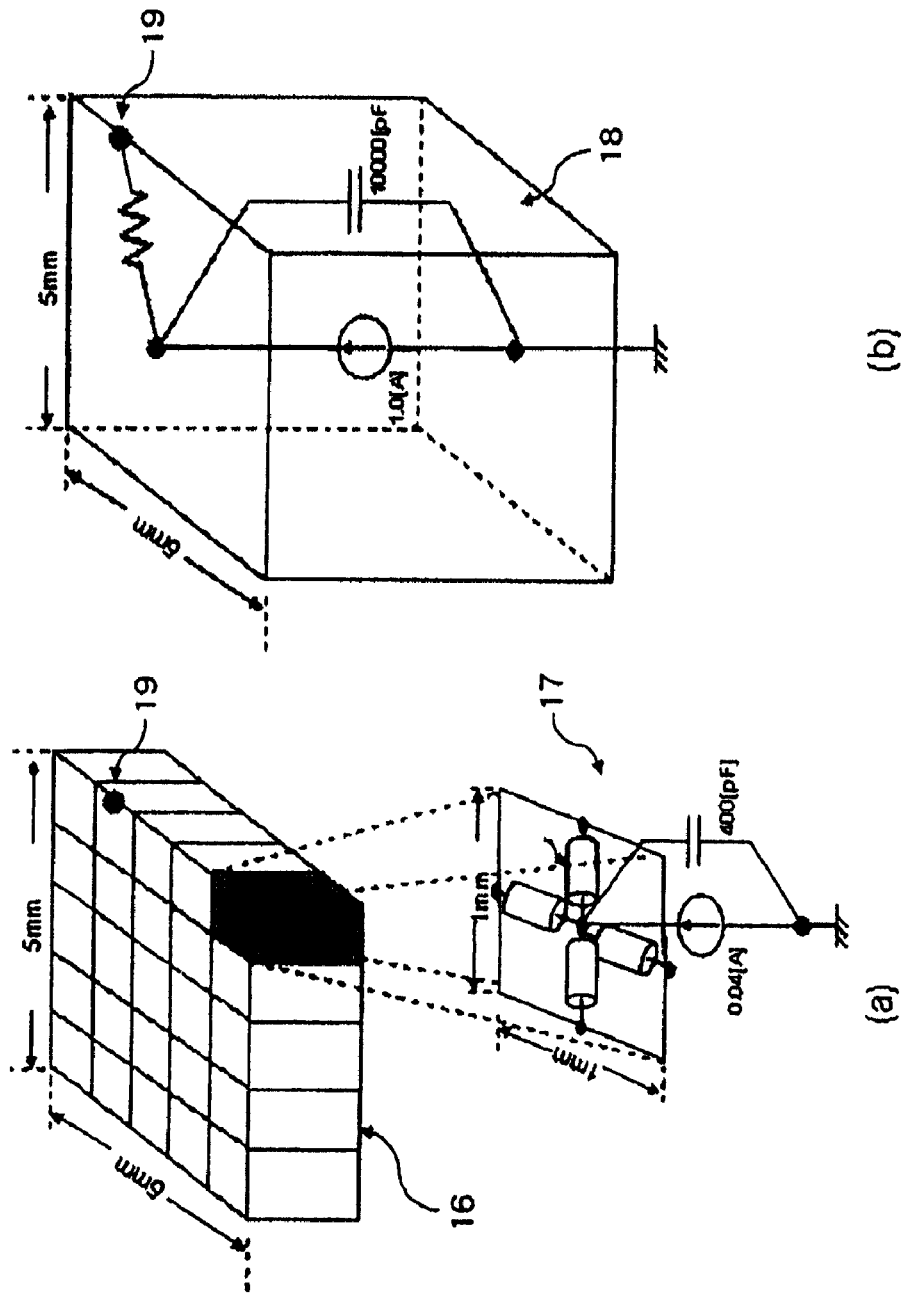
[FIG. 7]
FIG. 7 are diagrams showing an example of a power pin model within a semiconductor integrated circuit created by the semiconductor integrated circuit power pin model creating apparatus according to the first embodiment of the present invention, and an example of a power pin model within a conventional semiconductor integrated circuit, respectively.

As a specific example of this embodiment, processing operations are shown for creating the model shown in FIG. 7(*a*) using the automatic creation supporting apparatus of FIG. 19 through the steps described in FIG. 4.

First, input data 80 is entered to processing unit 71 through input device 74, and the data is stored in storage device 73. This input data 80 contains data required to create a model, including analysis frequency information 4 which includes an F-λ table which describes the upper limit analysis frequency of 1 GHz, and wavelength λ1 GHz0 of 300 [mm] corresponding thereto in vacuum; size information 5 which describes the chip size of 5 [mm]×5 [mm] of LSI, and semiconductor integrated circuit entire power pin model 7 which describes an active section using a model of a current source and which describes an internal capacitance section using a single lumped capacitive element, the value of the amplitude of the current source being 1 [A], and an internal capacitance being 3500 [pF]; the number of power supply circuit network layers (only one layer at this time) which is other input data; power supply circuit network wiring structure information 2 of power supply circuit network wiring structure information LSI which includes the length, width, and thickness of power supply circuit network wires, the type of a dielectric material, and the like; transistor structure information 3 which includes the gate width and gate length of a transistor which forms the internal capacitance section, the surface area of a diffusion layer in the transistor, and the like; and element arrangement information 6 which is layout information on the active section and internal capacitance of the LSI, showing that the active section and internal capacitance of the LSI are distributed within the LSI at an equal proportion.

Next, assume that the processing of the model production program of FIG. 18 is initiated by reading model production program 79 from recording medium 77 to control processing unit 71.

Next, stored power supply circuit network wiring structure information 2 is read from storage device 73, and it is determined from this data whether or not a power pin model to be created has one power supply circuit network layer (steps 301, 302). Since it is determined from the data that there is one power supply circuit network layer, processing at steps 303-314 is executed in accordance with FIG. 18.

First, at step 303, stored power supply circuit network wiring structure information 2 is again read from storage device 73, and Cline1=50 [pF] is calculated as a total value of wire capacitances from power supply circuit network wiring structure information 2, which is then stored in storage device 73.

Next, at step 304 stored transistor structure information 3 is read from storage device 73, and Cin1=10000 [pF] is calculated as a total value of internal capacitances (step 112), which is then stored in storage device 73.

Next, at step 305, stored power supply circuit network wiring structure information 2 is again read from storage device 73, and value ηn=0.5 of the wavelength shortening in vacuum is calculated from the specific dielectric constant of the dielectric material (step 113), which is then stored in storage device 73.

Next, at step 306, the stored values of Cline1=50 [pF], Cin1=10000 [pF], and η n=0.5 are read from storage device 73, and the value of the wavelength shortening of the power supply circuit network wires:

[Equation 12]

$$\eta_{d1} = \frac{0.5}{\sqrt{(50+10000)/50}} \approx 0.0353$$

when internal capacitances are present (step 114 in FIG. 3), is calculated, which is then stored in storage device 73.

Next, at step 307, the stored analysis frequency of 1 GHz is read from storage device 73, values in the F–λ table stored in database 78 is read from recording medium 77, the value of wavelength of λ 1 GHz0=300 [mm] in vacuum and the value of η d1=0.0353 are read from them, and wavelength:

$$\lambda min1 = 0.0353 \times 300 \approx 10.6 \text{ [mm]}$$

corresponding to the upper limit analysis frequency is calculated (step 115), which is then stored in storage device 73.

Next, at step 308, "n=10" is entered through input device 74 as the value of n in Equation (6), and stored in storage device 73.

Next, at step 309, the stored values of λmin1=10.6 [mm], n=10, and size information 5, which indicates that the chip size of the LSI is 5 [mm]×5 [mm], are read from storage device 73, and Equation (5) is processed to calculate candidate values for length lcell1 of one side of divided cells:

$$lcell1 \leq 10.6/10 = 1.06 \text{ [mm]}$$

which are then stored in storage device 73. Herein, the condition: lcell1≦1.06 [mm], and an optimal value are stored in storage device 73. In this case, the combination of the size information with the condition provides optimal value 1=1.0 [mm], which is a maximum integer that satisfies condition.

Next, at step 310, the stored condition equation of lcell1≦1.06 [mm] and lcell1=1.0 [mm], which is optimal value 1, are read from storage device 73 and the value of lcell1 is selected. Here, a determination is made as to whether or not lcell1 is automatically determined to be optimal value 1. Assume herein that lcell1 is automatically determined to be the value of optimal value 1=1.0 [mm], then 1 cell1=1.0 [mm] is determined (processing from steps 308 to 310 correspond to step 116 in FIG. 3), and stored in storage device 73. In this case, step 311 in FIG. 18 is not executed. In this case, since the cell has a size of 1 [mm]×1 [mm], the LSI is made up of 25 divided cells.

Next, at step 312, power supply circuit network wiring structure information 2 and the value of lcell1=1.0 [mm] are read from storage device 73, a template for a model of a power supply circuit network is read from database 78, a model of a power supply circuit network is created for each cell, wherein models described with distributed constants and created using the value of ∈r=4, are arranged in a cross-like manner for each wire (step 121), and the configuration of the model of the power supply circuit network for each cell is stored in storage device 73.

Next, at step 313, element arrangement information 6 which describes that the active section and the internal capacitance of the LSI are distributed on the entire LSI at an equal proportion, information 7 of the semiconductor integrated circuit entire power pin model which describes that an active section is described using a model of a current source and an internal capacitance section is described using a single lumped capacitive element, the value of the amplitude of the current source is 1 [A], and an internal capacitance of is 3500 [pF]; value of lcell1=1.0 [mm], and the configuration of the model of the power supply circuit network for each cell are read from storage device 73, a template for a power pin model is further read from database 78, the value of the amplitude of the current source is calculated as 1/25=0.04 [A], the capacitance value is calculated as 10000/25=400 [pF] in each cell, a power pin model in each cell is created (step 122), and the configuration of the power pin model of each cell is stored in storage device 73.

Next, at step 314, the stored configuration of the power pin model of each cell is read from storage device 73, and the cells are coupled to one another (step 131) to create power pin model 81 (corresponding to power pin model 10 in FIG. 4 and to power pin model 11 in FIG. 6) for the LSI. This result is output from output device 76. The structure of the model thus output is shown in FIG. 7(a).

The invention claimed is:

1. A method of creating a power pin model of a semiconductor integrated circuit, said model comprising a combination of cells that are divided to have a cell size in accordance with a size of the semiconductor integrated circuit, each cell comprising one layer of a power supply circuit network including wires with capacitive components and ground, an internal active section existing between said power supply circuit network and ground and performing an operation in said semiconductor integrated circuit, and an internal capacitive section existing between said power supply circuit network and ground and being inoperative in said semiconductor integrated circuit, said method comprising:

calculating λmin1 in accordance with the following equation:

$$\lambda_{min1} = \frac{\eta_n * \lambda_{min0}}{\sqrt{(Cline1 + Cin1)/Cline1}}$$

where ηn is the value of a wavelength shortening derived from a dielectric material contained in the wires in a power supply circuit network layer, Cline1 a total value of wiring capacitances appearing between the wires in the power supply circuit network layer and ground, Cin1 is a total value of internal capacitances added between the wires and ground, and λmin0 is the wavelength in vacuum corresponding to an upper limit frequency Fmax, determining length lcell1 of one side of each cell which takes a value that is electrically sufficiently shorter than the value of λminn1;

creating, from power supply circuit network wiring structure information of the semiconductor integrated circuit and the value of lcell1, a model of the power supply circuit network of each cell, including wire models existing in a reticular pattern, a terminal at a center of each cell connected to the internal active section and to the internal capacitance section, connection terminals on outer sides for coupling with adjacent cells, and inserting a model of the internal active section and a model of the internal capacitance section into each cell at a proportion based on element arrangement information of the semiconductor integrated circuit, an entire power pin model of the semiconductor integrated circuit, and the value of lcell1, for connection with the model of the power supply circuit network;

coupling said model of the power supply circuit network, said model of the internal active section, and said model of the internal capacitance section through the respective connection terminals with the adjacent cells to derive a power pin model of an overall semiconductor integrated circuit having only one power supply circuit network layer; and outputting a derived power pin model.

2. The method of creating a power pin model of a semiconductor integrated circuit according to claim 1, wherein said internal active section exists in each cell at the proportion in accordance with element arrangement information in said semiconductor integrated circuit and a size of said each cell.

3. The method of creating a power pin model of a semiconductor integrated circuit according to claim 1, wherein said internal capacitive section exists in each cell at the proportion in accordance with element arrangement information in said overall semiconductor integrated circuit and a size of said each cell.

4. The method of creating a power pin model of a semiconductor integrated circuit according to claim 1, wherein each cell comprises a plurality of internal active sections which differ from one another.

5. The method of creating a power pin model of a semiconductor integrated circuit according to claim 4, wherein a plurality of internal active sections exist in each cell at the proportion in accordance with element arrangement information in said overall semiconductor integrated circuit and a size of said each cell.

6. The method of creating a power pin model of a semiconductor integrated circuit according to claim 1, wherein each cell comprises a plurality of internal capacitance sections which differ from one another.

7. The method of creating a power pin model of a semiconductor integrated circuit according to claim 6, wherein a plurality of internal capacitance sections exist in each cell at the proportion in accordance with element arrangement information in said overall semiconductor integrated circuit and a size of said each cell.

8. A method of designing a power pin model of a semiconductor integrated circuit having a plurality of power supply systems, wherein a common cell division size is determined in the plurality of power supply systems, each cell comprises a plurality of power supply systems, and the power pin model according to claim 1 exists for each power supply system within the cell.

9. A computer-readable storage medium storing a computer program for creating a power pin model of a semiconductor integrated circuit, wherein the program, when executed by a processor, causes a computer to execute the method of creating a power pin model of a semiconductor integrated circuit according to claim 1.

10. A method of creating a power pin model of a semiconductor integrated circuit comprising a combination of cells divided to have a cell size in accordance with a size of the semiconductor integrated circuit, each cell comprising two layers of power supply circuit networks each including wires with capacitive components and ground, an internal active section existing between said two layers of power supply circuit networks and performing an operation in said semiconductor integrated circuit, and an internal capacitive section existing between said two layers of power supply circuit networks and being inoperative in said semiconductor integrated circuit, said method comprising:

calculating λmin2 in accordance with the following equation:

$$\lambda_{min2} = \frac{\eta_n * \lambda_{min0}}{\sqrt{(Cline2 + Cin2)/Cline2}}$$

where ηn is the value of a wavelength shortening derived from a dielectric material contained in the wires in a power supply circuit network layer, Cline2 is a total value of wiring capacitances appearing between the wires in the two power supply circuit network layers and ground, Cin2 is a total value of internal capacitances added between the wires in the two power supply circuit network layers, and λmin0 is the wavelength in vacuum corresponding to an upper limit frequency Fmax, determining length lcell2 of one side of each cell which takes a value that is electrically sufficiently shorter than the value of λminn2;

creating, from power supply circuit network wiring structure information of the semiconductor integrated circuit and the value of lcell2, a model of the power supply circuit network of each cell, including wire models existing in a reticular pattern, a terminal at a center of each cell connected to the internal active section and to the internal capacitance section, connection terminals on outer sides for coupling with adjacent cells, and inserting a model of the internal active section and a model of the internal capacitance section into each cell at a proportion based on element arrangement information of the semiconductor integrated circuit, an entire power pin model of the semiconductor integrated circuit, and the value of lcell2, for connection with the model of the power supply circuit network;

coupling said model of the power supply circuit network, said model of the internal active section, and said model of the internal capacitance section through the respective connection terminals with the adjacent cells to derive a power pin model of an overall semiconductor integrated circuit having two power supply circuit network layers-; and outputting a derived power pin model.

11. The method of creating a power pin model of a semiconductor integrated circuit according to claim 10, wherein said internal active section exists in each cell at the proportion in accordance with element arrangement information in said semiconductor integrated circuit and a size of said each cell.

12. The method of creating a power pin model of a semiconductor integrated circuit according to claim 10, wherein said internal capacitive section exists in each cell at the proportion in accordance with element arrangement information in said overall semiconductor integrated circuit and a size of said each cell.

13. The method of creating a power pin model of a semiconductor integrated circuit according to claim 10, wherein each cell comprises a plurality of internal active sections which differ from one another.

14. The method of creating a power pin model of a semiconductor integrated circuit according to claim 13, wherein a plurality of internal active sections exist in each cell at the proportion in accordance with element arrangement information in said overall semiconductor integrated circuit and a size of said each cell.

15. The method of creating a power pin model of a semiconductor integrated circuit according to claim 10, wherein each cell comprises a plurality of internal capacitance sections which differ from one another.

16. The method of creating a power pin model of a semiconductor integrated circuit according to claim 15, wherein a plurality of internal capacitance sections exist in each cell at the proportion in accordance with element arrangement information in said overall semiconductor integrated circuit and a size of said each cell.

17. A method of designing a power pin model of a semiconductor integrated circuit having a plurality of power supply systems, wherein a common cell division size is determined in the plurality of power supply systems, each cell comprises a plurality of power supply systems, and the power pin model according to claim 10 exists for each power supply system within the cell.

18. A computer-readable storage medium storing a computer program for creating a power pin model of a semiconductor integrated circuit, wherein the program, when executed by a processor, causes a computer to execute the method of creating a power pin model of a semiconductor integrated circuit according to claim 10.

19. An apparatus for creating a power pin model of a semiconductor integrated circuit comprising a combination of cells that are divided to have a cell size in accordance with a size of the semiconductor integrated circuit, each cell comprising one layer of a power supply circuit network including wires with capacitive components and ground, one or more internal active sections existing between said power supply circuit network and ground and performing an operation in said semiconductor integrated circuit, and one or more internal capacitive sections existing between said power supply circuit network and ground and being inoperative in said semiconductor integrated circuit, said apparatus comprising:

divided cell size determining unit for determining λmin1 in accordance with the following equation:

$$\lambda_{min1} = \frac{\eta_n * \lambda_{min0}}{\sqrt{(Cline1 + Cin1)/Cline1}}$$

where ηn is the value of a wavelength shortening derived from a dielectric material contained in the wires in a power supply circuit network layer, Cline1 is a total value of wiring capacitances appearing between the wires in the power supply circuit network layer and ground, Cin1 is a total value of internal capacitances added between the wires and ground, and λmin0 is the wavelength in vacuum corresponding to an upper limit frequency Fmax, and for determining length lcell1 of one side of each cell which takes a value that is electrically sufficiently shorter than the value of λminn1;

model creating unit for creating, from power supply circuit network wiring structure information of the semiconductor integrated circuit and the value of lcell1, a model of the power supply circuit network of each cell, including wire models existing in a reticular pattern, a terminal at a center of the cell connected to one or more internal active sections and to one or more internal capacitance sections, connection terminals on outer sides for coupling with adjacent cells, and for inserting a model of the one or more internal active sections and a model of the one or more internal capacitance sections into each cell at a proportion based on element arrangement information of the semiconductor integrated circuit, an entire power pin model of the semiconductor integrated circuit, and the value of lcell1, for connection with the model of the power supply circuit network;

model coupling unit for coupling said model of the power supply circuit network, said model of the one or more internal active sections, and said model of the one or more internal capacitance sections through the respective connection terminals with the adjacent cells to derive a power pin model of an overall semiconductor integrated circuit having only one power supply circuit network layer;

outputting unit for outputting a derived power pin model; and storing unit as a work area for said divided cell size determining unit, said model creating unit, and said model coupling unit, for storing information required to create said power pin model including information on a power supply circuit network wiring structure of the semiconductor integrated circuit, information on a transistor structure of the semiconductor integrated circuit, analysis frequency information which is information on an upper limit frequency when a model is used, information on the size of the semiconductor integrated circuit, and an entire power pin model of the semiconductor integrated circuit.

20. An apparatus for creating a power pin model of a semiconductor integrated circuit comprising a combination of cells that are divided to have a cell size in accordance with a size of the semiconductor integrated circuit, each cell comprising two layers of power supply circuit networks including wires with capacitive components and ground, one or more internal active sections existing between said two layers of power supply circuit networks and performing an operation in said semiconductor integrated circuit, and one or more internal capacitive sections existing between said two layers of power supply circuit networks and being inoperative in said semiconductor integrated circuit, said apparatus comprising:

divided cell size determining unit for calculating λmin2 in accordance with the following equation:

$$\lambda_{min2} = \frac{\eta_n * \lambda_{min0}}{\sqrt{(Cline2 + Cin2)/Cline2}}$$

where ηn is the value of a wavelength shortening derived from a dielectric material contained in the wires in a power supply circuit network layer, Cline2 is a total value of wiring capacitances appearing between the wires in the two power supply circuit network layers and ground, Cin2 is a total value of internal capacitances added between the two power supply circuit network layers, and λmin0 is the wavelength in vacuum corresponding to an upper limit frequency Fmax,
for determining length lcell2 of one side of each cell which takes a value that is electrically sufficiently shorter than the value of λminn2;

model creating unit for creating, from power supply circuit network wiring structure information of the semiconductor integrated circuit and the value of lcell2, a model of the power supply circuit network of each cell, including wire models existing in a reticular pattern, a terminal at a center of each cell connected to the one or more internal active sections and to the one or more internal capacitance sections, coupling terminals on outer sides for coupling with adjacent cells, and for inserting a model of the one or more internal active sections and a model of the one or more internal capacitance sections into each cell at a proportion based on element arrangement information of the semiconductor integrated circuit, an entire power pin model of the semiconductor integrated circuit, and the value of lcell2, for connection with the model of the power supply circuit network;

model coupling unit for coupling said model of the power supply circuit network, said model of the one or more internal active sections, and said model of the one or more internal capacitance sections through the respective connection terminals with the adjacent cells to derive a power pin model of an overall semiconductor integrated circuit having two power supply circuit network layers ;

outputting unit for outputting a derived power pin model; and storing unit as a work area for said divided cell size determining unit, said model creating unit, and said model coupling unit, for storing information required to create said power pin model, said information including information on a power supply circuit network wiring structure of the semiconductor integrated circuit, information on a transistor structure of the semiconductor integrated circuit, analysis frequency information which is information on an upper limit frequency when a model is used, information on the size of the semiconductor integrated circuit, and an entire power pin model of the semiconductor integrated circuit.

21. An apparatus for creating a power pin model of a semiconductor integrated circuit having a plurality of power supply systems and comprising a combination of cells that are divided to have a cell size in accordance with a size of the semiconductor integrated circuit, each cell of each power supply system comprising one layer of a power supply circuit network including wires with capacitive components and ground, one or more internal active sections existing between said power supply circuit network and ground and performing an operation in said semiconductor integrated circuit, and one or more internal capacitive sections existing between said power supply circuit network and ground and being inoperative in said semiconductor integrated circuit, said apparatus comprising:

divided cell size determining unit for calculating λmin1 in each power supply system in accordance with the following equation:

$$\lambda_{min1} = \frac{\eta_n * \lambda_{min0}}{\sqrt{(Cline1 + Cin1)/Cline1}}$$

where ηn is the value of a wavelength shortening derived from a dielectric material contained in the wires in a power supply circuit network layer of each power supply system, Cline1 is a total value of wiring capacitances appearing between the wires in each power supply circuit network layer and ground, Cin1 is a total value of internal capacitances added between the wires and ground, and λmin0 is the wavelength in vacuum corresponding to an upper limit frequency Fmax,
determining length lcell1 of one side of each cell which takes a value that is electrically sufficiently shorter than the value of λminn1 in all the power supply systems;

model creating unit for creating, from, power supply circuit network wiring structure information of the semiconductor integrated circuit and the value of lcell1, a model of the power supply circuit network of each cell, including wire models existing in a reticular pattern, a terminal at a center of each cell connected to one or more internal active sections and to one or more internal capacitance sections, coupling terminals on outer sides for coupling with adjacent cells for each power supply system, and inserting a model of the one or more internal active sections and a model of the one or more internal capacitance sections into each cell of each power supply system at a proportion based on element arrangement information of the semiconductor integrated circuit, an entire power pin model of the semiconductor integrated circuit, and the value of lcell1, for connection with said model of the power supply circuit network;

model coupling unit for coupling said model of the power supply circuit network, said model of the one or more internal active sections, and said model of the one or more internal capacitance sections in each cell of each power supply system through the respective connection terminals with the adjacent cells to derive a power pin model of an overall semiconductor integrated circuit having only one power supply circuit network layer for each power supply system;

outputting unit for outputting a derived power pin model; and storing unit serving as a work area for said divided cell size determining unit, said model creating unit, and said model coupling unit, for storing information required to create said power pin model, said information including information on a power supply circuit network wiring structure of the semiconductor integrated circuit, information on a transistor structure of the semiconductor integrated circuit, analysis frequency information which is information on an upper limit frequency when a model is used, information on the size of the semiconductor integrated circuit, and an entire power pin model of the semiconductor integrated circuit.

22. An apparatus for creating a power pin model of a semiconductor integrated circuit having a plurality of power supply systems and comprising a combination of cells that are divided to have a cell size in accordance with a size of the semiconductor integrated circuit, each cell of each power supply system comprising two layers of power supply circuit networks including wires with capacitive components and ground, one or more internal active sections existing between said two layers of power supply circuit networks and performing an operation in said semiconductor integrated circuit, and one or more internal capacitive sections existing between said two layers of power supply circuit networks and being inoperative in said semiconductor integrated circuit, said apparatus comprising:

divided cell size determining unit for calculating $\lambda min2$ in accordance with the following equation:

$$\lambda_{min2} = \frac{\eta_n * \lambda_{min0}}{\sqrt{(Cline2 + Cin2)/Cline2}}$$

where $\eta n$ is the value of a wavelength shortening derived from a dielectric material contained in the wires in a power supply circuit network layer of each power supply system, Cline2 is a total value of wiring capacitances appearing between the wires in the two power supply circuit network layers of each power supply system and ground, Cin2 is a total value of internal capacitances added between the wires in the two power supply circuit network layers, and $\lambda min0$ is the wavelength in vacuum corresponding to an upper limit frequency Fmax, determining length lcell2 of one side of each cell which takes a value that is electrically sufficiently shorter than the value of $\lambda minn2$ in all the power supply systems;

model creating unit for creating, from power supply circuit network wiring structure information of the semiconductor integrated circuit and the value of lcell2, a model of the power supply circuit network of each cell, including wire models existing in a reticular pattern, a terminal at a center of each cell connected to the one or more internal active sections and to the one or more internal capacitance sections, coupling terminals on outer sides for coupling with adjacent cells for each power supply system, and for inserting a model of the one or more internal active sections and a model of the one or more internal capacitance sections into each cell of each power supply system at a proportion based on element arrangement information of the semiconductor integrated circuit, an entire power pin model of the semiconductor integrated circuit, and the value of lcell2, for connection with said model of the power supply circuit network;

model coupling unit for coupling said model of the power supply circuit network, said model of the one or more internal active sections, and said model of the one or more internal capacitance sections in each cell of each power supply system through the respective connection terminals with the adjacent cells to derive a power pin model of an overall semiconductor integrated circuit having two power supply circuit network layers for each power supply system by;

outputting unit for outputting a derived power pin model; and storing unit as a work area for said divided cell size determining unit, said model creating unit, and said model coupling unit, for storing information required to create said power pin model, said information including information on a power supply circuit network wiring structure of the semiconductor integrated circuit, information on a transistor structure of the semiconductor integrated circuit, analysis frequency information which is information on an upper limit frequency when a model is used, information on the size of the semiconductor integrated circuit, and an entire power pin model of the semiconductor integrated circuit.

* * * * *

UNITED STATES PATENT AND TRADEMARK OFFICE
CERTIFICATE OF CORRECTION

PATENT NO. : 7,962,320 B2
APPLICATION NO. : 11/914066
DATED : June 14, 2011
INVENTOR(S) : Masashi Ogawa and Hiroshi Wabuka Page 1 of 1

It is certified that error appears in the above-identified patent and that said Letters Patent is hereby corrected as shown below:

In the Specification

Column 10, Line 43: delete "η" and insert -- λ --

In the Claims

Column 34, Line 33: In Claim 19, before "for" delete "and"

Column 36, Line 45: In Claim 21, delete "from," and insert -- from --

Signed and Sealed this
Fifteenth Day of April, 2014

Michelle K. Lee
*Deputy Director of the United States Patent and Trademark Office*